(12) United States Patent
Abematsu et al.

(10) Patent No.: US 9,190,378 B2
(45) Date of Patent: Nov. 17, 2015

(54) SEMICONDUCTOR CHIP AND SEMICONDUCTOR DEVICE

(71) Applicant: RENESAS ELECTRONICS CORPORATION, Kawasaki-shi, Kanagawa (JP)

(72) Inventors: Takashi Abematsu, Kanagawa (JP); Takafumi Betsui, Kanagawa (JP); Atsushi Kuroda, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/294,978

(22) Filed: Jun. 3, 2014

(65) Prior Publication Data

US 2014/0284818 A1  Sep. 25, 2014

Related U.S. Application Data

(63) Continuation of application No. 14/187,118, filed on Feb. 21, 2014.

(30) Foreign Application Priority Data

Feb. 22, 2013 (JP) .................................. 2013-033097
Jun. 17, 2013 (JP) .................................. 2013-126533

(51) Int. Cl.
*H01L 23/52* (2006.01)
*H01L 23/00* (2006.01)
(Continued)

(52) U.S. Cl.
CPC .............. *H01L 24/17* (2013.01); *H01L 21/563* (2013.01); *H01L 23/04* (2013.01); *H01L 23/12* (2013.01); *H01L 23/49816* (2013.01); *H01L 23/49838* (2013.01); *H01L 25/0657* (2013.01); *H01L 2224/16225* (2013.01);
(Continued)

(58) Field of Classification Search
CPC .......... H01L 23/12; H01L 23/52; H01L 24/17
USPC ........................................................ 257/778
See application file for complete search history.

(56) References Cited

U.S. PATENT DOCUMENTS 6,977,440 B2 * 12/2005 Pflughaupt et al. ........... 257/777
7,663,216 B2 *  2/2010 Yu et al. ......................... 257/686
(Continued)

FOREIGN PATENT DOCUMENTS

JP  10-074790 A  3/1998
JP  10-173087 A  6/1998
(Continued)

*Primary Examiner* — Christine Enad
(74) *Attorney, Agent, or Firm* — Miles & Stockbridge P.C.

(57) ABSTRACT

Provided is a semiconductor chip that is flip-chip mounted where an inner chip pad array and an outer chip pad array, which are arranged on an inner side and an outer side of IO cells in a staggered manner, are arranged to be spaced away from each other by a predetermined gap or greater. The predetermined gap represents a gap where one via can be arranged between an inner substrate pad array and an outer substrate pad array on a substrate which faces and is connected to the inner chip pad array and the outer chip pad array. In addition, the predetermined gap represents a gap where a plated wire is interconnected and then a resist opening for etch-back can be formed. Even in a case where a space for forming an interconnection is not present between outer substrate pad arrays, interconnection characteristics of the substrate are improved.

9 Claims, 24 Drawing Sheets

(51) Int. Cl.
  *H01L 23/498* (2006.01)
  *H01L 23/12* (2006.01)
  *H01L 25/065* (2006.01)
  *H01L 23/04* (2006.01)
  *H01L 21/56* (2006.01)

(52) U.S. Cl.
  CPC ............... *H01L 2224/32145* (2013.01); *H01L 2224/48227* (2013.01); *H01L 2224/48464* (2013.01); *H01L 2224/73265* (2013.01); *H01L 2225/0651* (2013.01); *H01L 2225/06517* (2013.01); *H01L 2225/06558* (2013.01); *H01L 2924/15311* (2013.01)

(56) References Cited

U.S. PATENT DOCUMENTS

| | | | |
|---|---|---|---|
| 2011/0133334 A1* | 6/2011 | Pendse | 257/737 |
| 2011/0248399 A1* | 10/2011 | Pendse | 257/737 |
| 2014/0360768 A1* | 12/2014 | Kang | 174/261 |

FOREIGN PATENT DOCUMENTS

| | | |
|---|---|---|
| JP | 2002-270779 A | 9/2002 |
| JP | 2008-252126 A | 10/2008 |

* cited by examiner (a) SEMICONDUCTOR CHIP  (b) SUBSTRATE (a) SEMICONDUCTOR CHIP  (b) SUBSTRATE (a) SEMICONDUCTOR CHIP    (b) SUBSTRATE (a) TOP SURFACE OF SUBSTRATE
(b) X-Y CROSS-SECTION IN CHIP-MOUNTED STATE (a) TOP SURFACE OF SUBSTRATE (a) TOP SURFACE OF SUBSTRATE (a) TOP SURFACE OF SUBSTRATE

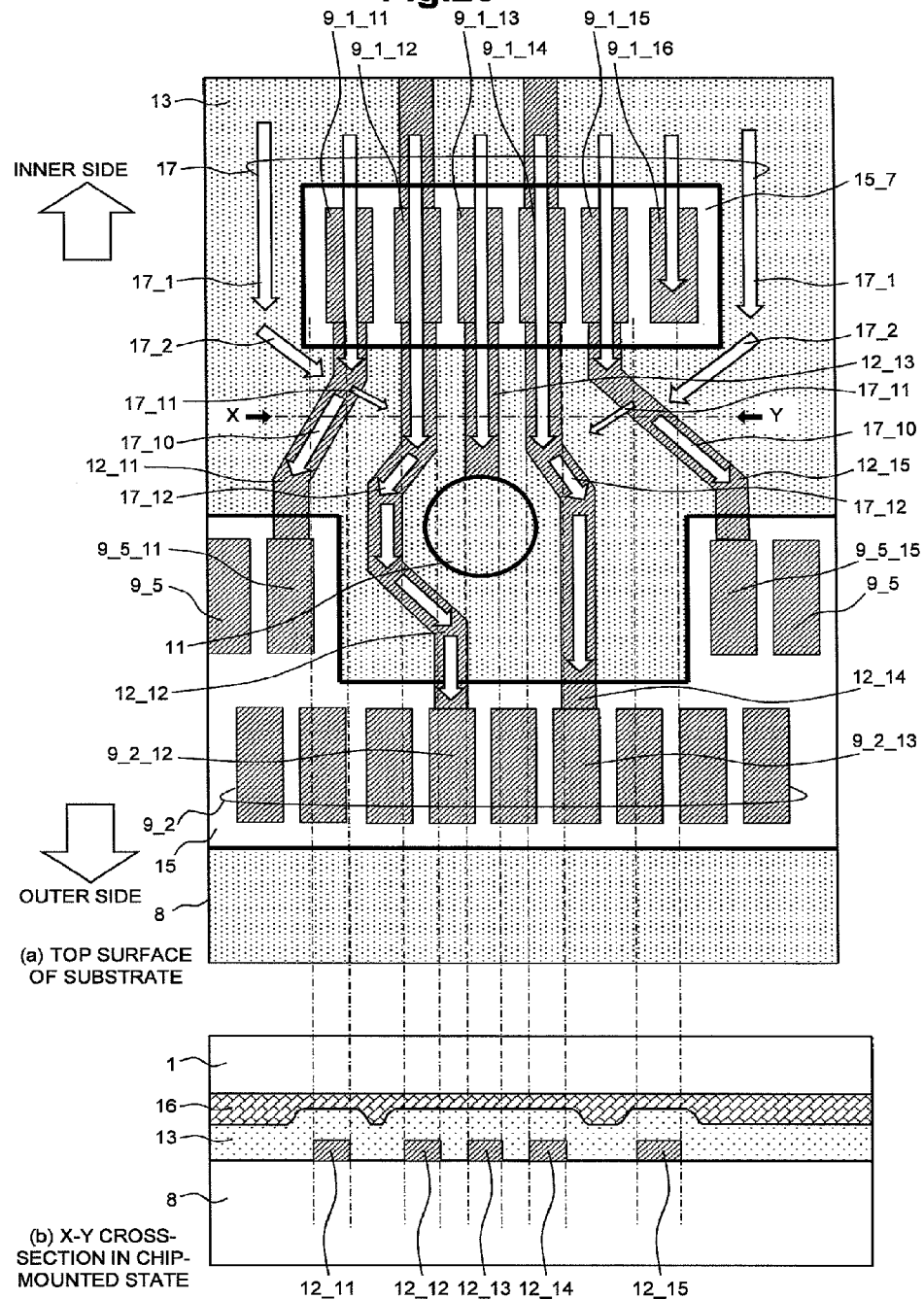

SEMICONDUCTOR CHIP AND SEMICONDUCTOR DEVICE

CROSS-REFERENCE TO RELATED APPLICATIONS

The Present application claims priority from Japanese application JP 2013-033097 filed on Feb. 22, 2013, and JP 2013-126533 filed on Jun. 17, 2013, the content of which is hereby incorporated by reference into this application.

BACKGROUND

The invention relates to a semiconductor chip that is flip-chip mounted in a substrate, and a semiconductor device on which the semiconductor chip is mounted, and more particularly, to a semiconductor chip and a semiconductor device that are suitably used for improvement of interconnection characteristics of mounting substrate.

With regard to the flip-chip mounting, in a substrate on which a semiconductor chip is mounted, a pad that is connected to a pad of the semiconductor chip is provided at a position facing the pad of the semiconductor chip. The pads are connected to each other through a bump and the like, thereby realizing electrical conduction. Hereinafter, the pad that is provided to the substrate to be connected to the semiconductor chip is referred to as "substrate pad", and the pad on the semiconductor chip is simply referred to as "pad" or "chip pad".

Along with improvement in a degree of integration, particularly, in a Large Scale Integrated circuit (LSI) such as a System on Chip (SoC), there is a tendency that a larger number of electrodes, that is, a larger number of pads is required in the semiconductor chip. With regard to an arrangement of the pad of the semiconductor chip, a so-called staggered arrangement, in which the pads are alternately arranged in two arrays at one side or both sides of input and output cells (IO cells) that are arranged in one array at each side of the semiconductor chip, is suggested. This is because the pads are significantly larger than the input and output cells, and thus the staggered arrangement has the best area efficiency.

JP-A-10-74790 discloses a technology of suppressing an area of a pad arrangement region in a case of arranging a plurality of pads on a surface of a semiconductor chip. At one side of an input and output buffer, the plurality of pads are arranged in a staggered shape in a plurality of arrays of two arrays or three or more arrays.

JP-A-2002-270779 discloses a technology of increasing an arrangement density of the TO pads without increasing a die size of the semiconductor chip. Input and output cells (IO cells) provided with an input and output circuit for electrical exchange with the outside are arranged in a ring shape at an outer peripheral portion of the semiconductor chip. The IO pads are arranged in a staggered shape with the IO cell arranged in a ring shape interposed therebetween.

In contrast, in the substrate on which the semiconductor chip is mounted, a substrate pad is arranged at a position facing the chip pad, and a through-hole via (hereinafter, simply referred to as "via") that penetrates through the entirety of the substrate or an interconnection layer that constitutes the substrate toward an opposite surface is arranged, and is interconnected to the substrate pad using the same interconnection layer as the substrate pad. Along with reduction in size of the semiconductor chip and an increase in the number of pins, a pitch between the pads becomes narrow, and congestion of the via and the interconnection becomes apparent in the substrate. For example, the via cannot be arranged in the vicinity of the substrate pad to which the via is connected, and thus leading-out of the interconnection from the substrate pad to the via becomes longer. Therefore, there are problems in that an interconnection impedance increases, electrical characteristics deteriorate, and the like. In addition, interconnection characteristics on a layout surface deteriorate and an area of the substrate increases. Therefore, for example, in a case where the substrate is a mounting substrate of an LSI package, there are problems in that the size of the package that can be accommodated increases, and the like.

JP-A-2008-252126 discloses a technology of removing a cause of an increase in semiconductor chip size in a Chip Size Package (CSP) type semiconductor device that employs Pad on Element (POE) technique and a staggered electrode pad arrangement. More specifically, when referring to FIG. 2, abstract, and paragraphs [0011] to [0013] of JP-A-2008-252126, the following technology is disclosed. Adjacent to corner cells 11 on a surface of a semiconductor chip 10, input and output cells 12 are formed so as to line up along the peripheral portion and each electrode pad 13 is formed on each of the input and output cells 12. The electrode pads 13 constitute an inner pad array and an outer pad array to form the staggered pad arrangement. However, among the electrode pads 13 that constitute the inner pad array, an electrode pad arrangement in a predetermined range adjacent to both sides of the corner cells 11 are omitted to prevent complication of interconnection patterns 21 of a carrier 20 (corresponding to the substrate) which is bump-connected to the semiconductor chip 10, and vias 22.

JP-A-10-173087 discloses a layout of a plated interconnection in a package substrate of a Ball Grid Array (BGA). The plated interconnection in the package substrate represents an interconnection on a substrate which applies an electric potential necessary for an electrolytic treatment to all electrodes to send a current so as to electrolytically plate the electrodes on front and rear surfaces of the substrate. As shown in FIG. 2 of JP-A-10-173087, the plated interconnection 9 leads out to the outside from a bonding lead.

SUMMARY

The present inventors have made an examination of JP-A-10-74790, JP-A-2002-270779, JP-A-2008-252126, and JP-A-10-173087, and as a result, they have found the following new problems.

In the pad arrangement disclosed in JP-A-10-74790, in a plurality of pad arrays that are close to the input and output buffer, an interconnection from the input and output buffer to another pad array that is more distant is necessary to pass through a space between pads. Therefore, it is difficult to set a pad pitch to the minimum pitch that is permitted from design constraints.

In the pad arrangement disclosed in JP-A-2002-270779, since each one array of pads is arranged on both sides of the cell, the above-described problem is solved and thus it is possible to set the pad pitch to the minimum pitch that is permitted from design constraints. However, JP-A-2002-270779 has no consideration for interconnection characteristics of the substrate in a case where the semiconductor chip is flip-chip mounted.

The pad arrangement disclosed in JP-A-2008-252126 is made in consideration of the interconnection characteristics of the substrate in a case where the semiconductor chip in which each array of pads is arranged on both sides of the IO cell is flip-chip mounted, particularly, the interconnection characteristics at a corner portion of the semiconductor chip. In the semiconductor chip, the pads, which constitute each of the inner pad array and the outer pad array of the IO cell, can be arranged with the minimum pitch that is permitted from design constraints. Similarly, substrate pads on a substrate side which are connected to the pads are arranged with the minimum pitch that is permitted from design constraints. Design constraints on the semiconductor chip and design constraints on the substrate may be different from each other, but it is practically difficult to allow an interconnection to pass through a space between substrate pads. Therefore, with regard to interconnections on the substrate, interconnections from an inner substrate pad array which is connected to the inner pad array of the semiconductor chip are limited to those in an inward direction, and interconnection from an outer substrate pad array which is connected to the outer pad array of the semiconductor chip are limited to those in an outward direction. Therefore, in the pad arrangement disclosed in JP-A-2008-252126, at the corner portion, the outer pad array remains and the pad arrangement of the inner pad array is omitted.

A problem in a case where the interconnections on the substrate from the inner substrate pad array are limited to those in the inward direction, and the interconnections from the outer substrate pad array are limited to those in the outward direction also appears in a layout of plated wires in the substrate. In the electrolytic treatment, it is necessary to apply the same electric potential to all of electrodes. Therefore, interconnection from the outer peripheral portion of the substrate to all electrodes is carried out using plated interconnections. Due to the restriction in which the interconnections on the substrate from the inner substrate pad array are limited to those in the inward direction, there is a problem in that it is difficult to lay out the plated interconnections, which apply the electric potential for the electrolytic treatment to the inner substrate pads, in a semiconductor chip mounting surface on the substrate. Therefore, it is necessary for the plated interconnections with respect to the inner substrate pads to be laid out on a BGA electrode surface. As a result, the arrangement of BGA electrodes is restricted, and thus there is a problem in that it is necessary to reduce the number of electrodes that can be arranged.

Means for solving the above-described problems will be described below, but other problems and new characteristics will be apparent from description of this specification and attached drawings.

An embodiment of the invention is as follows.

That is, according to an embodiment of the invention, there is provided a semiconductor device including a semiconductor chip which includes a plurality of chip pads, and a substrate on which the semiconductor chip is flip-chip mounted and which includes a substrate pad and a via that are connected to the chip pad. The semiconductor chip includes an input and output cell array in which input and output cells are linearly arranged, and an outer chip pad array and an inner chip pad array which are alternately present on an outer side and an inner side of the input and output cell array. At least two outer chip pads are included in the outer chip pad array, and at least one inner chip pad is included in the inner chip pad array. An inner substrate pad array that faces and is connected to the inner chip pad array, and an outer substrate pad array that faces and is connected to the outer chip pad array are provided to the substrate on which the semiconductor chip is flip-chip mounted. A gap between the outer substrate pads which are included in the outer substrate pad array and which are adjacent to each other is narrower than the sum of the minimum width of an interconnection which is permitted from design constraints on the substrate and two times a space value that is required for the interconnection and each of the substrate pads. At this time, arrangement is carried out in such a manner that a distance between the outer chip pad array and the inner chip pad array is equal to or greater than a predetermined gap. For example, the predetermined gap represents the sum of a diameter of the via that is provided to the substrate on which the semiconductor chip is flip-chip mounted, and two times a minimum space value that is required for a gap between the via and the substrate pad in design constraints. In addition, the predetermined gap represents a gap in which an opening for etch-back of a plated interconnection that short-circuits the inner substrate pads and the outer substrate pads can be provided in a resist film between the inner substrate pad array and the outer substrate pad array in the substrate.

Brief description of an effect that is obtained according to the embodiment is as follows.

Specifically, it is possible to improve interconnection characteristics of the substrate on which the semiconductor chip is flip-chip mounted. For example, in a case of defining the predetermined gap as described above on the basis of the diameter of the via and the space value between the via and the substrate pad, it is possible to improve interconnection characteristics of a signal interconnection and a power supply interconnection on the substrate. In addition, in a case of defining the predetermined gap as described above on the basis of the size of the opening, which is used to etch back the plated interconnection, in the resist film, it is possible to improve interconnection characteristics of the plated interconnection on the substrate.

BRIEF DESCRIPTION OF THE DRAWINGS

FIG. 26 is a layout diagram illustrating an example of an arrangement of substrate pads and interconnections in a substrate of a semiconductor device according to a tenth embodiment.

DETAILED DESCRIPTION

1. Summary of the Embodiments

Figure 1:
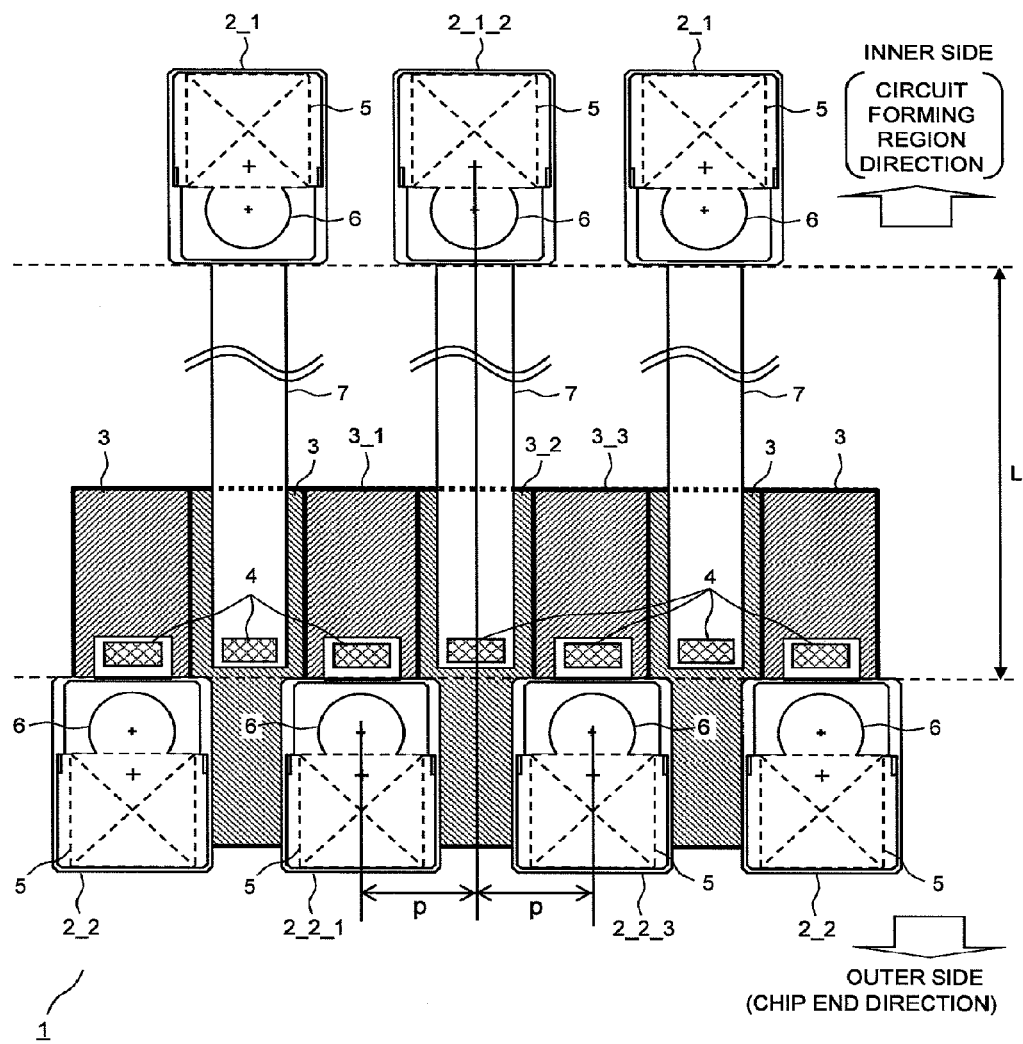
FIG. 1 is a layout diagram illustrating an arrangement of pads in a semiconductor chip according to a first embodiment or a second embodiment.

First, the summary of representative embodiments disclosed in this specification will be described. Reference numerals in the drawings, which are referenced in parentheses, only exemplify components that are included in the concept of components to which the reference numerals are given.

[1] <Mounted LSI; Gap Between Inner Pad and Outer Pad is Enlarged>

A semiconductor device (20) including a semiconductor chip (1) which includes a plurality of chip pads (2), and a substrate (8) on which the semiconductor chip is flip-chip mounted and which includes a substrate pad (9) and a via (11) which are connected to the chip pads is configured as follows.

The semiconductor chip includes an input and output cell array that is constituted by a plurality of input and output cells (3) including a first input and output cell (3_1), a second input and output cell (3_2), and a third input and output cell (3_3) which are linearly arranged and are adjacent to each other. The plurality of chip pads include a first pad (2_2_1) that is electrically connected to the first input and output cell, a second pad (2_1_2) that is electrically connected to the second input and output cell, and a third pad (2_2_3) that is electrically connected to the third input and output cell.

The substrate includes a first substrate pad (9_2_1) that faces and is connected to the first pad, a second substrate pad (9_1_2) that faces and is connected to the second pad, and a third substrate pad (9_2_3) that faces and is connected to the third pad. A gap between the first substrate pad and the third substrate pad is narrower than the sum of a minimum width of an interconnection which is permitted from design constraints on the substrate and two times a space value that is required for the interconnection and each of the substrate pads.

In the semiconductor chip, the first pad and the third pad are arranged adjacent to each other on a side further outward in comparison to the input and output cell array. The second pad is arranged on a side further inward in comparison to the input and output cell array, and is arranged to be spaced away from each of the first pad and the third pad by a predetermined distance. The predetermined distance represents a distance (L) that is equal to or greater than the sum of a diameter (L1) of the via provided to the substrate on which the semiconductor chip is flip-chip mounted and two times a minimum space value (L2) that is required for a gap between the via and each of the substrate pads in design constraints.

According to this, it is possible to improve interconnection characteristics of the substrate on which the semiconductor chip is flip-chip mounted. Particularly, it is possible to improve interconnection characteristics of a signal interconnection or a power supply interconnection on the substrate.

[2] <Outer Pads (Out-Line Pads) are Linearly Arranged with Minimum Pitch>

In the semiconductor device according to [1], the semiconductor chip may include a first pad array (2_2) in which a plurality of pads including the first pad and the third pad are adjacent to each other, and are linearly arranged in parallel with the input and output cell array on a side further outward in comparison to the input and output cell array, and the plurality of pads which are arranged adjacent to each other in the first pad array may be arranged with a minimum pitch that is required for a gap between pads of the semiconductor chip in design constraints.

According to this, even in a case of a pad neck in which the chip size of the semiconductor chip 1 is determined by the number of terminals, it is possible to suppress the chip size to be the same chip size as that of the related art.

[3] <Inner Pads (in-Line Pads) are Also Linearly Arranged with Minimum Pitch>

In the semiconductor device according to [2], the semiconductor chip may include a second pad array (2_1) in which a plurality of pads including the second pad are adjacent to each other, and are linearly arranged in parallel with the input and output cell array on a side further inward in comparison to the input and output cell array, and the plurality of pads which are arranged adjacent to each other in the second pad array may be arranged with a minimum pitch that is required for a gap between pads of the semiconductor chip in design constraints.

According to this, in the semiconductor chip 1, it is possible to secure the number of pads (the number of terminals) that is equal to that of the related art.

[4] <Pad for Probing>

In the semiconductor device according to [1], the semiconductor chip may further include a fourth pad (2_3) which is electrically connected to the second input and output cell and is arranged between the second pad and the input and output cell array on a side further inward in comparison to the input and output cell array.

According to this, it is possible to arrange a pad for probing at a position at which a pressure of a needle pad for probing is not applied to an internal circuit.

The substrate may include the first substrate pad (9_2_1) that faces and is connected to the first pad, the second substrate pad (9_1_2) that faces and is connected to the second pad, and the third substrate pad (9_2_3) that faces and is connected to the third pad, and a substrate pad may not be arranged at a position that faces the fourth pad.

[5] <Corner Portion>

In the semiconductor device according to [3], when the input and output cell array is set as a first input and output cell array (3_W), and a plurality of input and output cells, which are linearly arranged at one corner portion of the semiconductor chip in a direction perpendicular to the first input and output cell array, is set as a second input and output cell array (3_S), the semiconductor chip may include a third pad array (2_2_S) that is linearly arranged in parallel with the second input and output cell array on a side further outward in comparison to the second input and output cell array, and a plurality of pads that are arranged adjacent to each other in the third pad array may be arranged with a minimum pitch that is required for a gap between pads of the semiconductor chip in design constraints.

According to this, it is possible to increase the number of pads that are arranged in the corner portion of the semiconductor chip 1 as in comparison to the related art.

[6] <Sharing of Via Between Pads Connected to Adjacent Input and Output Cells>

In the semiconductor device according to [1], the substrate may include the first substrate pad (9_2_1) that faces and is connected to the first pad, the second substrate pad (9_1_2) that faces and is connected to the second pad, and the third substrate pad (9_2_3) that faces and is connected to the third pad. The substrate may include an interconnection that connects the first substrate pad and the second substrate pad at the same interconnection layer as the first substrate pad and the second substrate pad, and a via (11_4) that is connected to the interconnection and is arranged between the first substrate pad and the second substrate pad.

According to this, in the inner pad array and the outer pad array, in a case of the same signal, the chip pads, which are connected to adjacent input and output cells, short-circuit corresponding substrate pads and share the via, and thus interconnection characteristics of the substrate can be further improved. Particularly, this is effective for a case in which all of the pads that are adjacent to each other are power supply pads or ground pads.

<7> <BGA>

In the semiconductor device according to any one of [1] to [6], the substrate may include a BGA pad (22) on a surface opposite to a surface provided with the substrate pads, and a BGA electrode (23) that is connected to the BGA pad.

According to this, in a semiconductor device (20_1) that is mounted on a BGA, it is possible to improve interconnection characteristics of the substrate.

[8] <System in Package (SiP)>

In the semiconductor device according to [7], when the semiconductor chip is set as a first semiconductor chip (1), the semiconductor device may further include a second semiconductor chip (24) that is stacked on the first semiconductor chip. When the substrate pads are set as first substrate pad groups (9_1 and 9_2), the substrate may further include a second substrate pad group (9_4) different from the first substrate pad groups on the same surface as the first substrate pad groups, and the second semiconductor chip may be connected to the second substrate pad group with a bonding wire (25).

According to this, it is possible to improve interconnection characteristics of the substrate in the SiP (202).

[9] <Package on Package (PoP)>

The semiconductor device according to [7] may further include a second semiconductor device (26) that includes a protrusion electrode (27) and is package-mounted.

When the substrate pads are set as first substrate pad groups (9_1 and 9_2), the substrate may further include a second substrate pad group (9_4) different from the first substrate pad groups on the same surface as the first substrate pad groups, and the second semiconductor device is stacked by connecting the protrusion electrode and the second substrate pad group.

According to this, it is possible to improve interconnection characteristics of the substrate in the PoP (20_3).

[10] <Semiconductor Chip for Flip-Chip; Gap Between Inner Pads and Outer Pads is Enlarged>

The semiconductor chip (1) includes an input and output cell array that is constituted by a plurality of input and output cells (3) including a first input and output cell (3_1), a second input and output cell (3_2), and a third input and output cell (3_3) which are linearly arranged and are adjacent to each other. Further, the semiconductor chip (1) includes a first pad (2_2_1) that is electrically connected to the first input and output cell, a second pad (2_1_2) that is electrically connected to the second input and output cell, and a third pad (2_2_3) that is electrically connected to the third input and output cell.

A substrate (8) on which the semiconductor chip is flip-chip mounted includes a first substrate pad (9_2_1) that faces and is connected to the first pad, a second substrate pad (9_1_2) that faces and is connected to the second pad, and a third substrate pad (9_2_3) that faces and is connected to the third pad. A gap between the first substrate pad and the third substrate pad is narrower than the sum of a minimum width of an interconnection which is permitted from design constraints on the substrate and two times a space value that is required for the interconnection and each of the substrate pads.

The first pad and the third pad are arranged adjacent to each other on a side further outward in comparison to the input and output cell array, and the second pad is arranged on a side further inward in comparison to the input and output cell array. The second pad is arranged to be spaced away from each of the first pad and the third pad by a distance (L) that is equal to or greater than the sum of a diameter (L1) of a via provided to the substrate on which the semiconductor chip is flip-chip mounted and two times a minimum space value (L2) required for a gap between the via and each of the substrate pads on the substrate which is connected to each of the pads of the semiconductor chip in design constraints.

According to this, it is possible to improve interconnection characteristics of the substrate on which the semiconductor chip is flip-chip mounted. Particularly, it is possible to improve interconnection characteristics of a signal interconnection or a power supply interconnection on the substrate.

[11] <Outer Pads (Out-Line Pads) are Linearly Arranged with Minimum Pitch>

The semiconductor chip according to [10] may include a first pad array (2_2) in which a plurality of pads including the first pad and third pad are adjacent to each other, and are linearly arranged in parallel with the input and output cell array on a side further outward as in comparison to the input and output cell array, and the plurality of pads which are arranged adjacent to each other in the first pad array may be arranged with a minimum pitch that is required for a gap between pads of the semiconductor chip in design constraints.

According to this, even in a case of a pad neck in which the chip size of the semiconductor chip 1 is determined by the number of terminals, it is possible to suppress the chip size to be the same chip size as that of the related art.

[12] <Inner Pads (in-Line Pads) are Also Linearly Arranged with Minimum Pitch>

The semiconductor chip according [11] may include a second pad array (2_1) in which a plurality of pads including the second pad are adjacent to each other, and are linearly arranged in parallel with the input and output cell array on a side further inward in comparison to the input and output cell array. The plurality of pads which are arranged adjacent to each other in the second pad array may be arranged with a minimum pitch that is required for a gap between pads of the semiconductor chip in design constraints.

According to this, in the semiconductor chip 1, it is possible to secure the number of pads (the number of terminals) that is equal to that of the related art.

[13] <Pad for Probing>

The semiconductor chip according to [10] may further include a fourth pad (2_3) which is electrically connected to the second input and output cell and is arranged between the second pad and the input and output cell array on a side further inward in comparison to the input and output cell array.

According to this, it is possible to arrange a pad for probing at a position at which a pressure of a needle pad for probing is not applied to an internal circuit.

[14] <Corner Portion>

In the semiconductor chip according to [12], when the input and output cell array is set as a first input and output cell array (3_W), and a plurality of input and output cells, which are linearly arranged at one corner portion of the semiconductor chip in a direction perpendicular to the first input and output cell array, is set as a second input and output cell array (3_S), the semiconductor chip may include a third pad array (2_2_S) that is linearly arranged in parallel with the second input and output cell array on a side further outward in comparison to the second input and output cell array.

A plurality of pads that are arranged adjacent to each other in the third pad array may be arranged with a minimum pitch that is required for a gap between pads of the semiconductor chip in design constraints.

According to this, it is possible to increase the number of pads that are arranged in the corner portion of the semiconductor chip 1 as in comparison to the related art.

[15] <Mounted LSI; Gap Between Inner Pad and Outer Pad is Enlarged by Size of Plated Interconnection>

A semiconductor device (20) including a semiconductor chip (1) which includes a plurality of chip pads (2), and a substrate (8) on which the semiconductor chip is flip-chip mounted is configured as follows.

The substrate includes substrate pads (9) that are connected to the chip pads, interconnections (12_1 to 12_6) in the same interconnection layer as the substrate pads, and a resist film (13) that covers at least a part of the interconnection.

The semiconductor chip includes an input and output cell array that is constituted by a plurality of input and output cells (3) including a first input and output cell (3_1), a second input and output cell (3_2), and a third input and output cell (3_3) which are linearly arranged and are adjacent to each other. The plurality of chip pads include a first pad (2_2_1) that is electrically connected to the first input and output cell, a second pad (2_1_2) that is electrically connected to the second input and output cell, and a third pad (2_2_3) that is electrically connected to the third input and output cell.

The substrate includes a first substrate pad (9_2_1) that faces and is connected to the first pad, a second substrate pad (9_1_2) that faces and is connected to the second pad, and a third substrate pad (9_2_3) that faces and is connected to the third pad. A gap between the first substrate pad and the third substrate pad is narrower than the sum of a minimum width of an interconnection which is permitted from design constraints on the substrate and two times a space value that is required for the interconnection and each of the substrate pads.

In the semiconductor chip, the first pad and the third pad are arranged adjacent to each other on a side further outward as in comparison to the input and output cell array, and the second pad is arranged on a side further inward in comparison to the input and output cell array.

In the substrate, an opening for etch-back of a plated interconnection (12_1) that short-circuits the first to third substrate pads is provided to a resist film (13_2, 13_3) between the second substrate pad and the first and third substrate pads.

According to this, it is possible to improve interconnection characteristics of the substrate on which the semiconductor chip is flip-chip mounted. Particularly, it is possible to improve interconnection characteristics of a plated interconnection on the substrate.

[16] <Outer Pads (Out-Line Pads) are Linearly Arranged with Minimum Pitch>

In the semiconductor device according to [15], the semiconductor chip may include a first pad array (2_2) in which a plurality of pads including the first pad and third pad are adjacent to each other, and are linearly arranged in parallel with the input and output cell array on a side further outward in comparison to the input and output cell array, and the plurality of pads which are arranged adjacent to each other in the first pad array may be arranged with a minimum pitch that is required for a gap between pads of the semiconductor chip in design constraints.

According to this, even in a case of a pad neck in which the chip size of the semiconductor chip 1 is determined by the number of terminals, it is possible to suppress the chip size to be the same chip size as that of the related art.

[17] <Inner Pads (in-Line Pads) are Also Linearly Arranged with Minimum Pitch>

In the semiconductor device according to [16], the semiconductor chip may include a second pad array ($2\_1$) in which a plurality of pads including the second pad are adjacent to each other, and are linearly arranged in parallel with the input and output cell array on a side further inward in comparison to the input and output cell array. The plurality of pads which are arranged adjacent to each other in the second pad array may be arranged with a minimum pitch that is required for a gap between pads of the semiconductor chip in design constraints.

According to this, in the semiconductor chip 1, it is possible to secure the number of pads (the number of terminals) that is equal to that of the related art.

[18] <Pad for Probing>

In the semiconductor device according to [15], the semiconductor chip may further include a fourth pad ($2\_3$) which is electrically connected to the second input and output cell and is arranged between the second pad and the input and output cell array on a side further inward in comparison to the input and output cell array.

According to this, it is possible to arrange a pad for probing at a position at which a pressure of a needle pad for probing is not applied to an internal circuit.

The substrate may include the first substrate pad ($9\_2\_1$) that faces and is connected to the first pad, the second substrate pad ($9\_1\_2$) that faces and is connected to the second pad, and the third substrate pad ($9\_2\_3$) that faces and is connected to the third pad, and a substrate pad may not be arranged at a position that faces the fourth pad.

[19] <Corner Portion>

In the semiconductor device according to [17], when the input and output cell array is set as a first input and output cell array ($3\_W$), and a plurality of input and output cells, which are linearly arranged at one corner portion of the semiconductor chip in a direction perpendicular to the first input and output cell array, is set as a second input and output cell array ($3\_S$), the semiconductor chip may include a third pad array ($2\_2\_S$) that is linearly arranged in parallel with the second input and output cell array on a side further outward in comparison to the second input and output cell array, and a plurality of pads that are arranged adjacent to each other in the third pad array may be arranged with a minimum pitch that is required for a gap between pads of the semiconductor chip in design constraints.

According to this, it is possible to increase the number of pads that can be arranged at a corner portion of the semiconductor chip 1 as in comparison to the related art.

[20] <Sharing of Via Between Pads Connected to Adjacent Input and Output Cells>

In the semiconductor device according to [15], the substrate may include an interconnection that connects the first substrate pad and the second substrate pad at the same interconnection layer as the first substrate pad and the second substrate pad, and a via ($11\_4$) that is connected to the interconnection and is arranged between the first substrate pad and the second substrate pad.

According to this, in the inner pad array and the outer pad array, in a case of the same signal, the chip pads, which are connected to adjacent input and output cells, short-circuit corresponding substrate pads and share the via, and thus interconnection characteristics of the substrate can be further improved. Particularly, this is effective for a case in which all of the pads that are adjacent to each other are power supply pads or ground pads.

[21] <BGA>

In the semiconductor device according to any one of [15] to [20], the substrate may include a BGA pad (22) on a surface opposite to a surface provided with the substrate pads, and a BGA electrode (23) that is connected to the BGA pad.

According to this, in a semiconductor device ($20\_1$) that is mounted on a BGA, it is possible to improve interconnection characteristics of the substrate.

[22] <SiP>

In the semiconductor device according to [21], when the semiconductor chip is set as a first semiconductor chip (1), the semiconductor device may further include a second semiconductor chip (24) that is stacked on the first semiconductor chip. When the substrate pads are set as first substrate pad groups ($9\_1$ and $9\_2$), the substrate may further include a second substrate pad group ($9\_4$) different from the first substrate pad groups on the same surface as the first substrate pad groups, and the second semiconductor chip may be connected to the second substrate pad group with a bonding wire (25).

According to this, it is possible to improve interconnection characteristics of the substrate in the SiP ($20\_2$).

[23] <PoP>

The semiconductor device according to [21] may further include a second semiconductor device (26) that includes an protrusion electrode (27) and is package-mounted.

When the substrate pads are set as first substrate pad groups ($9\_1$ and $9\_2$), the substrate may further include a second substrate pad group ($9\_4$) different from the first substrate pad groups on the same surface as the first substrate pad groups, and the second semiconductor device is stacked by connecting the protrusion electrode and the second substrate pad group.

According to this, it is possible to improve interconnection characteristics of the substrate in the PoP ($20\_3$).

[24] <Semiconductor Chip for Flip-Chip; Gap Between Inner Pads and Outer Pads is Enlarged by Size of Plated Interconnect Ion>

The semiconductor chip (1) includes an input and output cell array that is constituted by a plurality of input and output cells (3) including a first input and output cell ($3\_1$), a second input and output cell ($3\_2$), and a third input and output cell ($3\_3$) which are linearly arranged and are adjacent to each other. Further, the semiconductor chip (1) includes a first pad ($2\_2\_1$) that is electrically connected to the first input and output cell, a second pad ($2\_1\_2$) that is electrically connected to the second input and output cell, and a third pad ($2\_2\_3$) that is electrically connected to the third input and output cell.

A substrate (8) on which the semiconductor chip is flip-chip mounted includes a first substrate pad ($9\_2\_1$) that faces and is connected to the first pad, a second substrate pad ($9\_1\_2$) that faces and is connected to the second pad, and a third substrate pad ($9\_2\_3$) that faces and is connected to the third pad. A gap between the first substrate pad and the third substrate pad is narrower than the sum of a minimum width of an interconnection which is permitted from design constraints on the substrate and two times a space value that is required for the interconnection and each of the substrate pads.

The first pad and the third pad are arranged adjacent to each other on a side further outward in comparison to the input and output cell array, and the second pad is arranged on a side further inward in comparison to the input and output cell array. The second pad is arranged to be spaced away from each of the first pad and the third pad by a predetermined gap or greater.

The predetermined gap is defined by a gap in which an opening for etch-back of a plated interconnection (12_1) that short-circuits the first to third substrate pads can be provided to a resist film (13_2, 13_3) between the second substrate pad and the first and third substrate pads in the substrate.

According to this, it is possible to improve interconnection characteristics of the substrate on which the semiconductor chip is flip-chip mounted. Particularly, it is possible to improve interconnection characteristics of a plated interconnection on the substrate.

[25] <Outer Pads (Out-Line Pads) are Linearly Arranged with Minimum Pitch>

The semiconductor chip according to [24] may include a first pad array (2_2) in which a plurality of pads including the first pad and third pad are adjacent to each other, and are linearly arranged in parallel with the input and output cell array on a side further outward in comparison to the input and output cell array, and the plurality of pads which are arranged adjacent to each other in the first pad array may be arranged with a minimum pitch that is required for a gap between pads of the semiconductor chip in design constraints.

According to this, even in a case of a pad neck in which the chip size of the semiconductor chip 1 is determined by the number of terminals, it is possible to suppress the chip size to be the same chip size as that of the related art.

[26] <Inner Pads (in-Line Pads) are Also Linearly Arranged with Minimum Pitch>

The semiconductor chip according to [25] may include a second pad array (2_1) in which a plurality of pads including the second pad are adjacent to each other, and are linearly arranged in parallel with the input and output cell array on a side further inward in comparison to the input and output cell array. The plurality of pads which are arranged adjacent to each other in the second pad array may be arranged with a minimum pitch that is required for a gap between pads of the semiconductor chip in design constraints.

According to this, in the semiconductor chip 1, it is possible to secure the number of pads (the number of terminals) that is equal to that of the related art.

[27] <Pad for Probing>

The semiconductor chip according to [24] may further include a fourth pad (2_3) which is electrically connected to the second input and output cell and is arranged between the second pad and the input and output cell array on a side further inward comparison to the input and output cell array.

According to this, it is possible to arrange a pad for probing at a position at which a pressure of a needle pad for probing is not applied to an internal circuit.

[28] <Corner Portion>

In the semiconductor chip according to [26], when the input and output cell array is set as a first input and output cell array (3_W), and a plurality of input and output cells, which are linearly arranged at one corner portion of the semiconductor chip in a direction perpendicular to the first input and output cell array, is set as a second input and output cell array (3_S), the semiconductor chip may include a third pad array (2_2_S) that is linearly arranged in parallel with the second input and output cell array on a side further outward in comparison to the second input and output cell array.

A plurality of pads that are arranged adjacent to each other in the third pad array may be arranged with a minimum pitch that is required for a gap between pads of the semiconductor chip in design constraints.

According to this, it is possible to increase the number of pads that can be arranged in the corner portion of the semiconductor chip 1 as in comparison to the related art.

[29] <Mounted LSI; Number of Substrate Pads Per One Solder Resist Opening is Limited>

In the semiconductor device according to [1], the semiconductor chip may be flip-chip mounted on the substrate with a liquid curable resin (16) interposed between the semiconductor chip and the substrate.

The semiconductor chip may include a first pad array (2_2) in which a plurality of pads including the first pad and third pad are adjacent to each other, and are linearly arranged in parallel with the input and output cell array on a side further outward in comparison to the input and output cell array, and a second pad array (2_1) in which a plurality of pads including the second pad are adjacent to each other, and are linearly arranged in parallel with the input and output cell array on a side further inward in comparison to the input and output cell array.

The substrate may include a solder resist (13), a first substrate pad array (9_2) constituted by a plurality of substrate pads that face and are connected to a plurality of pads that constitute the first pad array, and a second substrate pad array (9_1) constituted by a plurality of substrate pads that face and are connected to a plurality of pads that constitute the second pad array. The solder resist may be provided to a surface of the substrate on which the semiconductor chip is flip-chip mounted, and the solder resist may have a solder resist opening (15) in a region in which the plurality of substrate pads that constitute the second substrate pad array are arranged.

The number of the substrate pads that are arranged in the one solder resist opening may be calculated on the basis of a viscosity of the liquid curable resin during flip-chip mounting, a thickness of the solder resist, and a gap between the semiconductor chip and the substrate.

The liquid curable resin (16) is applied to a substrate (this is called pre-application) in a liquid state having a viscosity, and the semiconductor chip is flip-chip mounted on the substrate from an upper side thereof and is superimposed thereon, and is bonded thereto by compression. After the flip-chip mounting, the liquid curable resin is cured into an underfill (16). When the semiconductor device (20) employs the above-described configuration, even when the liquid curable resin is pre-applied as an underfill, and then the semiconductor chip is compressed and bonded to the substrate to carry out flip-chip mounting, a large void that spans a plurality of substrate pads is not formed in the solder resist opening, and thus reliability of the semiconductor device can be increased.

[30] <Shape of Solder Resist Opening>

In the semiconductor device according to [1], the semiconductor chip may be flip-chip mounted on the substrate with a liquid curable resin (16) interposed between the semiconductor chip and the substrate.

The semiconductor chip may include a first pad array (2_2) in which a plurality of pads including the first pad and third pad are adjacent to each other, and are linearly arranged in parallel with the input and output cell array on a side further outward in comparison to the input and output cell array, and a second pad array (2_1) in which a plurality of pads including the second pad are adjacent to each other, and are linearly arranged in parallel with the input and output cell array on a side further inward in comparison to the input and output cell array.

The substrate may include a solder resist (13), a first substrate pad array (9_2) constituted by a plurality of substrate pads that face and are connected to a plurality of pads that constitute the first pad array, and a second substrate pad array (9_1) constituted by a plurality of substrate pads that face and are connected to a plurality of pads that constitute the second pad array. The solder resist may be provided to a surface of the substrate on which the semiconductor chip is flip-chip mounted, and the solder resist may have a solder resist opening (15_4) in a region in which the plurality of substrate pads that constitute the second substrate pad array are arranged.

The solder resist opening may have a concave portion in a side that is far away from the first substrate pad array at a position that faces a gap between the plurality of substrate pads, and a convex portion in a side that is close to the first substrate pad array at a position that faces a side of each of the plurality of substrate pads.

According to this, even when the liquid curable resin is pre-applied as an underfill, and then the semiconductor chip is compressed and bonded to the substrate to carry out flip-chip mounting, a large void that spans a plurality of substrate pads is not formed in the solder resist opening, and thus reliability of the semiconductor device can be increased.

[31] <Gap Between Substrate Pads in Solder Resist Opening is Narrowed>

In the semiconductor device according to [1], the semiconductor chip may be flip-chip mounted on the substrate with a liquid curable resin (16) interposed between the semiconductor chip and the substrate.

The semiconductor chip may include a first pad array (2_2) in which a plurality of pads including the first pad and third pad are adjacent to each other, and are linearly arranged in parallel with the input and output cell array on a side further outward in comparison to the input and output cell array, and a second pad array (2_1) in which a plurality of pads including the second pad are adjacent to each other, and are linearly arranged in parallel with the input and output cell array on a side further inward in comparison to the input and output cell array.

The substrate may include a solder resist (13), a first substrate pad array (9_2) constituted by a plurality of substrate pads that face and are connected to a plurality of pads that constitute the first pad array, and a second substrate pad array (9_1) constituted by a plurality of substrate pads that face and are connected to a plurality of pads that constitute the second pad array. The solder resist may be provided to a surface of the substrate on which the semiconductor chip is flip-chip mounted, and the solder resist may have a solder resist opening (15_5) in a region in which the plurality of substrate pads that constitute the second substrate pad array are arranged.

The plurality of substrate pads that constitute the second substrate pad array in the solder resist opening may be arranged with a minimum gap that is permitted for the substrate pads from a design aspect.

According to this, even when the liquid curable resin is pre-applied as an underfill, and then the semiconductor chip is compressed and bonded to the substrate to carry out flip-chip mounting, a large void that spans a plurality of substrate pads is not formed in the solder resist opening, and thus reliability of the semiconductor device can be increased.

[32] <Shape of Substrate Pad in Solder Resist Opening>

In the semiconductor device according to [1], the semiconductor chip may be flip-chip mounted on the substrate with a liquid curable resin (16) interposed between the semiconductor chip and the substrate.

The semiconductor chip may include a first pad array (2_2) in which a plurality of pads including the first pad and third pad are adjacent to each other, and are linearly arranged in parallel with the input and output cell array on a side further outward in comparison to the input and output cell array, and a second pad array (2_1) in which a plurality of pads including the second pad are adjacent to each other, and are linearly arranged in parallel with the input and output cell array on a side further inward in comparison to the input and output cell array.

The substrate may include a solder resist (13), a first substrate pad array (9_2) constituted by a plurality of substrate pads that face and are connected to a plurality of pads that constitute the first pad array, and a second substrate pad array (9_1) constituted by a plurality of substrate pads that face and are connected to a plurality of pads that constitute the second pad array. The solder resist may be provided to a surface of the substrate on which the semiconductor chip is flip-chip mounted, and the solder resist may have a solder resist opening (15_6) in a region in which the plurality of substrate pads that constitute the second substrate pad array are arranged.

Each of the plurality of substrate pads that constitute the second substrate pad array in the solder resist opening may have a convex portion in a side that is far away from the first substrate pad array.

According to this, even when the liquid curable resin is pre-applied as an underfill, and then the semiconductor chip is compressed and bonded to the substrate to carry out flip-chip mounting, a large void that spans a plurality of substrate pads is not formed in the solder resist opening, and thus reliability of the semiconductor device can be increased.

[33] <Capillary Phenomenon by Outward Interconnection Connected to Substrate Pad at Both Ends of Solder Resist Opening>

In the semiconductor device according to [1], the semiconductor chip may be flip-chip mounted on the substrate with a liquid curable resin (16) interposed between the semiconductor chip and the substrate.

The semiconductor chip may include a first pad array (2_2) in which a plurality of pads including the first pad and third pad are adjacent to each other, and are linearly arranged in parallel with the input and output cell array on a side further outward in comparison to the input and output cell array, and a second pad array (2_1) in which a plurality of pads including the second pad are adjacent to each other, and are linearly arranged in parallel with the input and output cell array on a side further inward in comparison to the input and output cell array.

The substrate may include a solder resist (13), a first substrate pad array (9_2) constituted by a plurality of substrate pads that face and are connected to a plurality of pads that constitute the first pad array, and a second substrate pad array (9_1) constituted by a plurality of substrate pads that face and are connected to a plurality of pads that constitute the second pad array. The solder resist may be provided to a surface of the substrate on which the semiconductor chip is flip-chip mounted, and the solder resist may have a solder resist opening (15_7) in a region in which the plurality of substrate pads that constitute the second substrate pad array are arranged.

Among the plurality of substrate pads that constitute the second substrate pad array in the solder resist opening, each of substrate pads (9_1_11) at both ends may be connected to an interconnection that extends on the substrate toward the first pad array.

According to this, even when the liquid curable resin is pre-applied as an underfill, and then the semiconductor chip is compressed and bonded to the substrate to carry out flip-chip mounting, a large void that spans a plurality of substrate pads is not formed in the solder resist opening, and thus reliability of the semiconductor device can be increased.

[34] <Semiconductor Chip for Flip-Chip, Number of Substrate Pads Per One Solder Resist Opening on Mounting Substrate is Limited>

The semiconductor chip according to [10] may be flip-chip mounted on the substrate with a liquid curable resin (16) interposed between the semiconductor chip and the substrate.

The semiconductor chip may include a first pad array (2_2) in which a plurality of pads including the first pad and third pad are adjacent to each other, and are linearly arranged in parallel with the input and output cell array on a side further outward in comparison to the input and output cell array, and a second pad array (2_1) in which a plurality of pads including the second pad are adjacent to each other, and are linearly arranged in parallel with the input and output cell array on a side further inward in comparison to the input and output cell array.

The substrate on which the semiconductor chip is flip-chip mounted may include a solder resist (13), a first substrate pad array (9_2) constituted by a plurality of substrate pads that face and are connected to a plurality of pads that constitute the first pad array, and a second substrate pad array (9_1) constituted by a plurality of substrate pads that face and are connected to a plurality of pads that constitute the second pad array.

The solder resist may be provided to a surface of the substrate on which the semiconductor chip is flip-chip mounted, and the solder resist may have a solder resist opening (15) in a region in which the plurality of substrate pads that constitute the second substrate pad array are arranged.

The number of the substrate pads that are arranged in the one solder resist opening may be calculated on the basis of a viscosity of the liquid curable resin during flip-chip mounting, a thickness of the solder resist, and a gap between the semiconductor chip and the substrate. In the semiconductor chip, the number of the second pads which are connected to the substrate pads arranged in the solder resist opening and which constitute the second pad array becomes the same as the number of the substrate pads.

According to this, in the semiconductor chip that is compressed and bonded to the substrate to be flip-chip mounted on the substrate after the liquid curable resin is pre-applied as an underfill to the substrate, it is possible to provide a semiconductor chip in which a large void that spans a plurality of substrate pads is not formed in the solder resist opening of a semiconductor device after the mounting, and thus reliability of the semiconductor device can be increased.

[35] <Capillary Phenomenon by Outward Interconnection Connected to Substrate Pad at Both Ends of Solder Resist Opening>

The semiconductor chip according to [10] may be flip-chip mounted on the substrate with a liquid curable resin (16) interposed between the semiconductor chip and the substrate.

The semiconductor chip may include a first pad array (2_2) in which a plurality of pads including the first pad and third pad are adjacent to each other, and are linearly arranged in parallel with the input and output cell array on a side further outward in comparison to the input and output cell array, and a second pad array (2_1) in which a plurality of pads including the second pad are adjacent to each other, and are linearly arranged in parallel with the input and output cell array on a side further inward in comparison to the input and output cell array. The semiconductor chip may include third and fourth pad arrays (2_5) which are linearly arranged at both sides of the second pad array in parallel with the input and output cell array on a side further inward in comparison to the input and output cell array and on a side further outward in comparison to the second pad array.

The substrate on which the semiconductor chip is flip-chip mounted may include a solder resist (13), a first substrate pad array (9_2) constituted by a plurality of substrate pads that face and are connected to a plurality of pads that constitute the first pad array, and a second substrate pad array (9_1) constituted by a plurality of substrate pads that face and are connected to a plurality of pads that constitute the second pad array. The substrate may further include a third substrate pad array constituted by a plurality of substrate pads (9_5) that face and are connected to a plurality of pads that constitute the third pad array, and a fourth substrate pad array constituted by a plurality of substrate pads (9_5) that face and are connected to a plurality of pads that constitute the fourth pad array.

The solder resist may be provided to a surface of the substrate on which the semiconductor chip is flip-chip mounted, and the solder resist may have a solder resist opening (15_7) in a region in which the plurality of substrate pads that constitute the second substrate pad array are arranged.

Pads of the second pad array, which are arranged at an end close to the third pad array, may be short-circuited on the substrate with pads of the third pad array which are arranged at an end close to the second pad array, and pads of the second pad array, which are arranged at an end close to the fourth pad array, may be short-circuited on the substrate with pads of the fourth pad array which are arranged at an end close to the second pad array.

According to this, in the semiconductor chip that is compressed and bonded to the substrate to be flip-chip mounted on the substrate after the liquid curable resin is pre-applied as an underfill to the substrate, it is possible to provide a semiconductor chip in which a large void that spans a plurality of substrate pads is not formed in the solder resist opening of a semiconductor device after the mounting, and thus reliability of the semiconductor device can be increased.

2. Further Detailed Description of Embodiments

The embodiments will be described in more detail.

First Embodiment

Gap Between Inner Pad and Outer Pad is Enlarged

Figure 2:
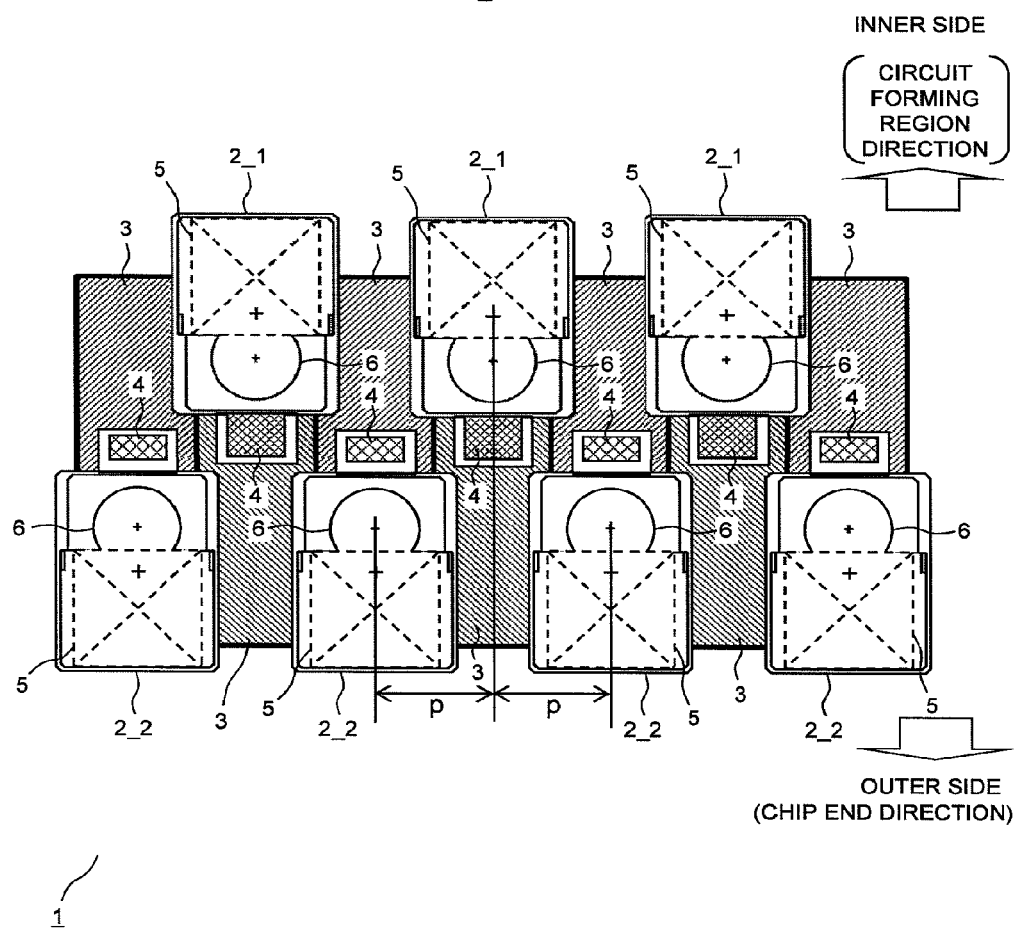
FIG. 2 is a layout diagram illustrating an arrangement of pads in a semiconductor chip in the related art.
Figure 3:
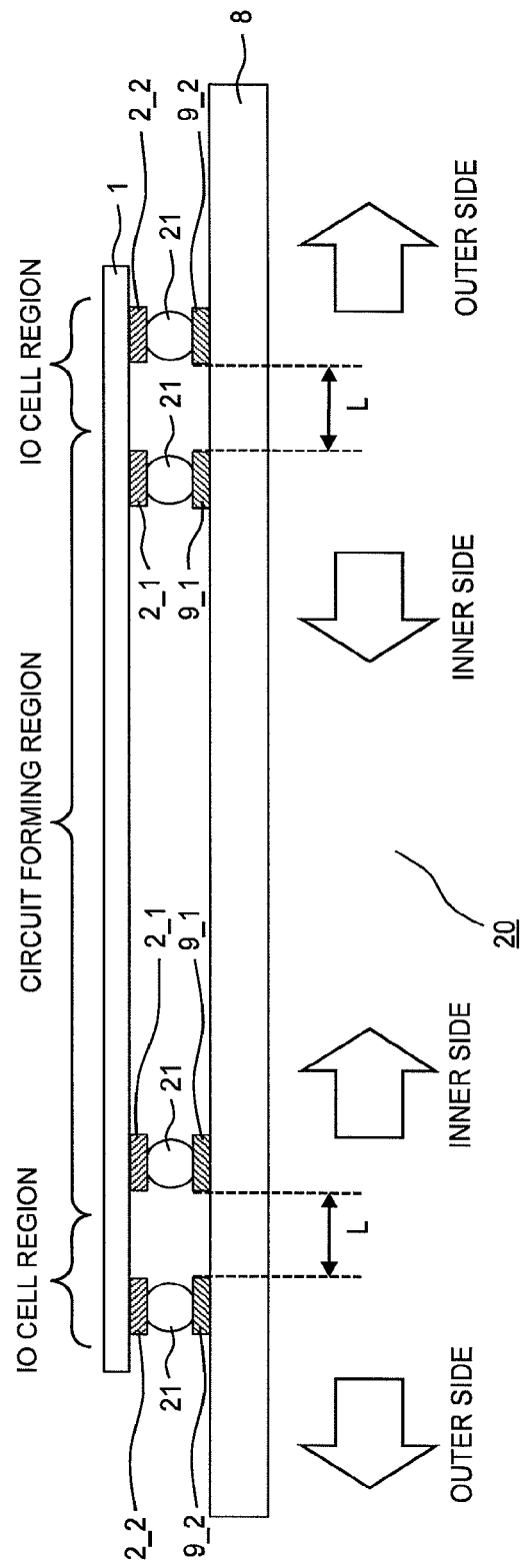
FIG. 3 is a schematic diagram illustrating a mounted state of a semiconductor device, in which the semiconductor chip according to the first embodiment or the second embodiment is flip-chip mounted on a substrate, in a cross-sectional direction.
Figure 4:
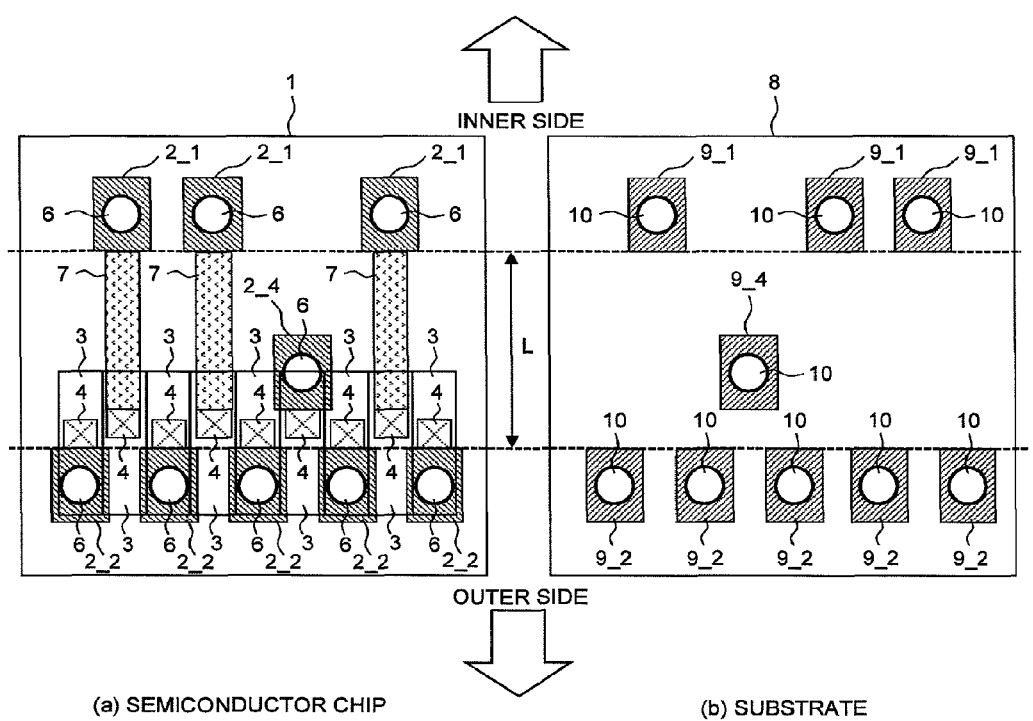
FIG. 4 is a schematic diagram illustrating a layout of the pads in the semiconductor chip according to the first embodiment or the second embodiment, and a layout of substrate pads in the substrate on which the semiconductor chip is flip-chip mounted.

FIG. 1 shows a layout diagram illustrating an arrangement of pads 2 in a semiconductor chip 1 according a first embodiment, and FIG. 2 shows a layout diagram illustrating an arrangement of pads in a semiconductor chip in the related art. FIG. 3 shows a schematic diagram illustrating a mounted state of a semiconductor device 20, in which the semiconductor chip 1 according to the first embodiment is flip-chip mounted on a substrate 8, in a cross-sectional direction, and FIG. 4 shows a schematic diagram illustrating a layout of the pads 2 in the semiconductor chip 1 according to the first embodiment and a second embodiment, and a layout of substrate pads 9 in the substrate 8 on which the semiconductor chip 1 is flip-chip mounted.

As shown in FIG. 3, the semiconductor device 20 according to the first embodiment is constructed by flip-chip mounting the semiconductor chip 1 on the substrate 8. The semiconductor chip 1 includes chip pads 2_1 and 2_2, and the substrate 8 includes substrate pads 9_1 and 9_2 that are connected to the chip pads 2_1 and 2_2, respectively, through a bump 21 and a via 11 (not shown). An example in which the connection is carried out through the bump 21 is shown, but another connection method is possible. FIG. 4 shows a schematic diagram illustrating a layout (a) of the chip pads 2_1 and 2_2 in the semiconductor chip 1 and a layout (b) of the substrate pads 9_1 and 9_2 in the substrate 8 on which the semiconductor chip 1 is flip-chip mounted. As shown in FIG. 4, the substrate pads 9_1 and 9_2 are arranged at positions that face the chip pads 2_1 and 2_2 to which the substrate pads 9_1 and 9_2 are connected. (a) and (b) of FIG. 4 are both top views, and thus the layout (a) of the chip pads 2_1 and 2_2 and the layout (b) of the substrate pads 9_1 and 9_2 are located at positions of a mirror-plane object.

FIG. 1 shows a layout diagram illustrating the arrangement of pads in a semiconductor chip according the first embodiment, and FIG. 2 shows a layout diagram illustrating the arrangement of pads in a semiconductor chip of the related art.

The semiconductor chip 1 includes an input and output cell array that is constituted by a plurality of input and output cells 3 including input and output cells 31 to 33 which are linearly arranged and are adjacent to each other. An electrode 4 for interconnection with a pad is provided to each of the input and output cells 3. A plurality of the chip pads 2 include pads 2_2_1, 2_1_2, and 2_2_3 that are electrically connected to the input and output cells 3_1, 3_2, and 3_3, respectively. A probing area 5 and a bonding area 6 are present in each of the pads 2. The probing area 5 is an area with which a probe is brought into contact so as to apply a test signal or to measure a signal that is output in an experiment on the semiconductor chip 1. The bonding area 6 is an area in which electrical connection of a signal between the pad 2 and the substrate 8 is carried out, and for example, a bump (protrusion electrode) is formed in the bonding area 6.

The substrate 8 includes substrate pads 9_2_1, 9_1_2, and 9_2_3 that face and are connected to the pads 2_2_1, 2_1_2, and 2_2_3 of the semiconductor chip 1, respectively. A gap between the substrate pad 9_2_1 and the substrate pad 9_2_3 is narrower than the sum of the minimum width of an interconnection which is permitted from design constraints on the substrate 8 and two times a space value that is required for the interconnection and each of the substrate pads 9. Accordingly, the interconnection cannot pass between the substrate pad 9_2_1 and the substrate pad 9_2_3.

In the semiconductor chip 1, the chip pad 2_2_1 and 2_2_3 are arranged adjacent to each other on a side further outward in comparison to the input and output cell array that is constituted by the plurality of input and output cells 3. In addition, the chip pad 2_1_2 is arranged on a side further inward in comparison to the input and output cell array that is constituted by the plurality of input and output cells 3. Here, the outer side represents a chip end direction of the semiconductor chip 1 and the inner side represents a tip center direction. As shown in FIG. 2, in a semiconductor chip of the related art, an outer pad array (out-line pads) and an inner pad array (in-line pads) of an input and output cell array are laid out in close proximity to each other. The outer pad array and the inner pad array are arranged with the minimum pitch that is required for the gap between pads of the semiconductor chip in design constraints. According to this, in a case of a pad neck in which the chip size of the semiconductor chip is determined by the number of pads (the number of terminals), it is possible to make the chip size as small as possible.

In contrast, in the semiconductor chip 1 of the first embodiment, the pad 2_1_2 is laid out to be spaced away from the pads 2_2_1 and 2_2_3 at a predetermined distance L. An interconnection 7 is interconnected between the pad 2_1_2 and the electrode 4 of the input and output cell 3_2. More suitably, the chip pads 2_2_1 and 2_2_3, which are connected to the substrate pads 9_2_1 and 9_2_3, respectively, are included in the outer pad array, and are arranged in a staggered manner with the minimum pitch 2p that is required for the gap between the pads 2 of the semiconductor chip 1 in design constraints. According to this, the outer and inner pads that are connected to adjacent input and output cells can be arranged with a gap of a pitch p that is half of the minimum pitch 2p required in design constraints. Accordingly, even in a case of a pad neck in which the chip size of the semiconductor chip 1 is determined by the number of terminals, the chip size can be suppressed to be equal to or less than that of the related art. In addition, the chip pad 2_1_2 that is connected to the substrate pad 9_1_2 is included in an inner pad array, and is arranged with the minimum pitch 2p that is required for a gap between the pads 2 of the semiconductor chip 1 in the design constraints. According to this, even in the semiconductor chip 1, the outer pads and the inner pads that are connected to adjacent input and output cells can be arranged with a gap of the pitch p that is half of the minimum pitch 2p that is required in design constraints, and thus the number of pads (the number of terminals) can be made to be equal to or greater than that of the related art.

An example of a method of defining the predetermined distance L will be described with reference to FIG. 5. The predetermined distance L is defined in consideration of interconnection characteristics in the substrate 8 on which the semiconductor chip 1 is flip-chip mounted.

Figure 5:
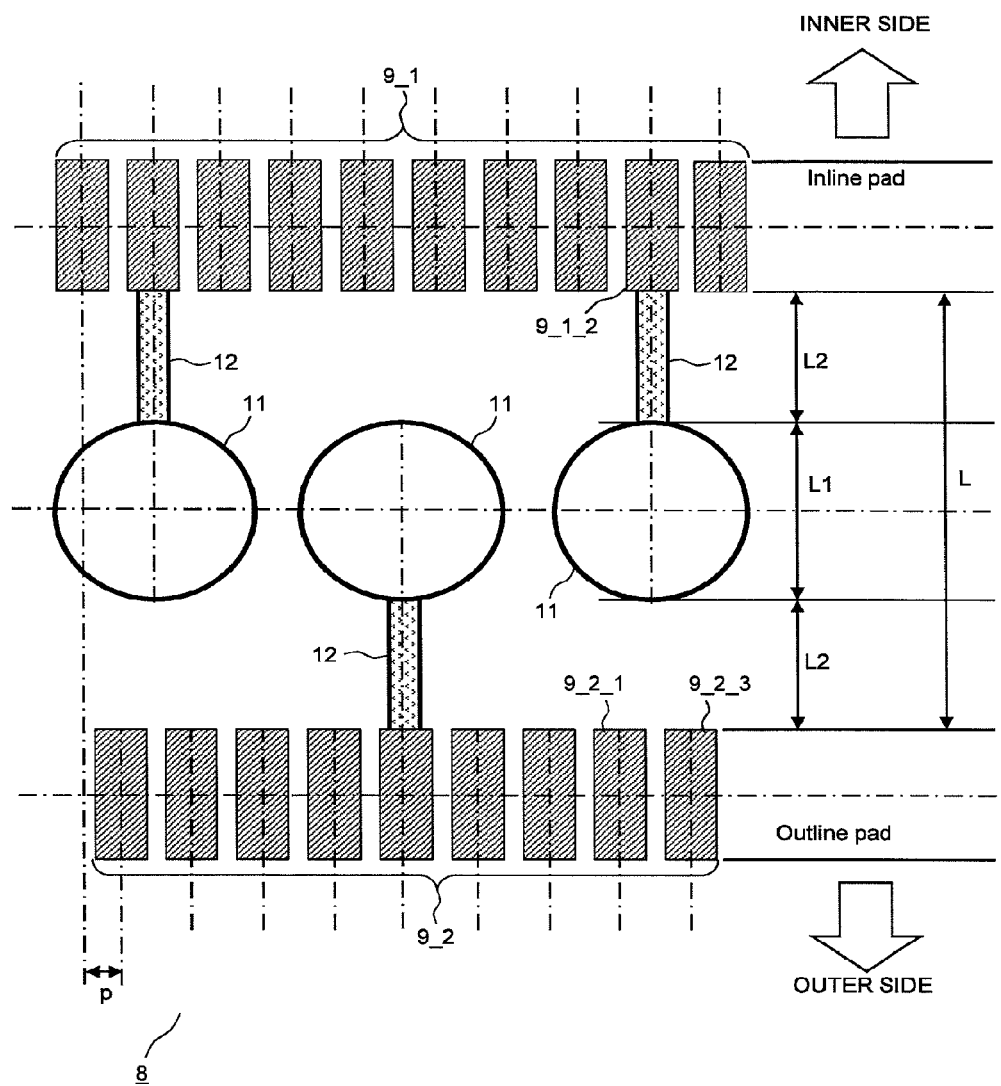
FIG. 5 is a layout diagram illustrating an arrangement of the substrate pads in the substrate on which the semiconductor chip according to the first embodiment is flip-chip mounted.

FIG. 5 shows a layout diagram illustrating an arrangement example of the substrate pads 9 in the substrate 8 on which the semiconductor chip 1 according to the first embodiment is flip-chip mounted. An inner substrate pad array (in-line pads) that is constituted by a plurality of substrate pads 9_1 that are connected to the inner pad array of the semiconductor chip 1, and an outer substrate pad array (out-line pads) that is constituted by a plurality of substrate pads 9_2 that are connected to the outer pad array of the semiconductor chip 1 are arranged on the substrate 8. At this time, the predetermined distance L is set to a distance with which at least one via 11 can be arranged between the outer substrate pad array and the inner substrate pad array in the substrate 8. More specifically, the predetermined distance L is set to a distance equal to or greater than the sum of a via diameter (L1) and two times the minimum space value (L2) that is required for a gap between the via and each of the substrate pads in design constraints. Along with this, the pad 2_1_2 on the semiconductor chip 1 is arranged to be spaced away from each of the chip pads 2_2_1 and 2_2_3 in order for the substrate pad 9_1_2 to which the pad 2_1_2 is connected to be spaced away from the substrate pads 9_2_1 and 9_2_3 that are connected to the chip pads 2_2_1 and 2_2_3, respectively, by the predetermined distance.

According to this, it is possible to improve the interconnection characteristics of the substrate on which the semiconductor chip is flip-chip mounted. Particularly, it is possible to improve interconnection characteristics of a signal interconnection and a power supply interconnection on the substrate.

An effect of the first embodiment will now be described.

Figure 6:
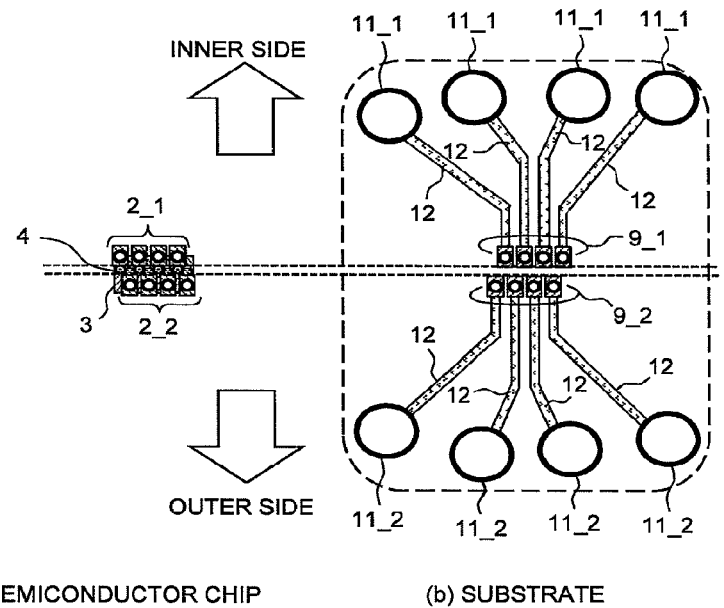
FIG. 6 is a layout diagram illustrating an arrangement example of the pads in the semiconductor chip of the related art, and an arrangement example of substrate pads in a substrate on which the semiconductor chip is flip-chip mounted.
Figure 7:
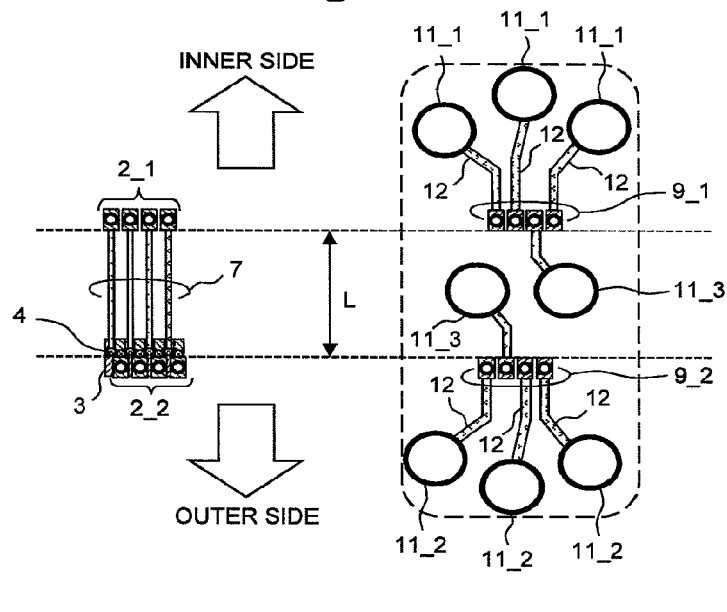
FIG. 7 is a layout diagram illustrating an arrangement example of the pads in the semiconductor chip according to the first embodiment, and an arrangement example of the substrate pads in the substrate on which the semiconductor chip is flip-chip mounted.

FIG. 6 shows a layout diagram illustrating an arrangement example of pads 2_1 and 2_2 in a semiconductor chip of the related art, and an arrangement example of substrate pads 9_1 and 9_2 in a substrate 8 on which the semiconductor chip is flip-chip mounted. FIG. 7 shows a layout diagram illustrating an arrangement example of the pads 2_1 and 2_2 in the semiconductor chip 1 according to the first embodiment, and an arrangement example of the substrate pads 9_1 and 9_2 in the substrate 8 on which the semiconductor chip 1 is flip-chip mounted. As shown in (a) of FIGS. 6 and 7, respectively, an inner pad array that is constituted by a plurality of pads 2_1 and an outer pad array that is constituted by a plurality of pads 2_2 are arranged in a staggered manner on a semiconductor chip 1 side. As shown in (b) of FIGS. 6 and 7, an inner substrate pad array that is constituted by a plurality of substrate pads 9_1, an outer substrate pad array that is constituted by a plurality of substrate pads 9_2, and a plurality of vias 11 that are connected to the inner substrate pad array and the outer substrate pad array by interconnections 12 that lead out from the respective substrate pads are shown on a substrate 8 side. When the pitch p of the pads of the semiconductor chip 1 is, for example, 25 μm, the diameter of the via 11 becomes 140 μm to 200 μm depending on a material of the substrate or processing accuracy. In FIGS. 6 and 7, a dimensional ratio between the pads and the via is drawn in a relatively faithful manner.

In the semiconductor chip of the related art which is shown in FIG. 6, the gap between the inter pad array and the outer pad array is narrow (a), and the gap between the inner substrate pad array and the outer substrate pad array of the substrate 8 which are connected to the inner pad array and the outer pad array of the semiconductor chip, respectively, is narrow (b). Therefore, the interconnections 12 and the vias 11_1, which are connected to the inner substrate pad array, only can be arranged in an inward direction, and the interconnections 12 and the vias 11_2, which are connected to the outer substrate pad array, only can be arranged in an outward direction. The diameter of the vias 11_1 and 11_2 is large as shown in FIG. 6, or is larger than that is shown, and thus a position at which the vias 11_1 and 11_2 can be arranged is not located in the vicinity of the substrate pads 9_1 and 9_2, and it is necessary to extend the interconnections to a distant position using a lot of signal lines. In FIG. 6, an interconnection region is expanded to a region indicated by a dashed line in (b). Only four inner substrate pads 9_1 and four outer substrate pads 9_2, and four vias 11_1 and four vias 11_2 are illustrated due to limitation of page space, but it is apparent that if the number of the pads and vias increases, a further wide interconnection region is necessary.

In the semiconductor chip 1 shown in FIG. 7 according to the first embodiment, the gap between the inner pad array and the outer pad array in the semiconductor chip is enlarged (refer to (a)) so as to enlarge the gap between the inner substrate pad array and the outer substrate pad array up to the distance L with which the vias 11 can be arranged as shown in FIG. 5. On a substrate 8 side shown in (b), since two vias 11_3 can be arranged between the inner substrate pad array and the outer substrate pad array, an interconnection region indicated by a dashed line becomes more narrow. Only four substrate pads 9_1 and four substrate pads 9_2, and vias 11_1, 11_2, and 11_3 are illustrated due to limitation of page space, but when the number of the substrate pads and vias increases, the difference in an area with the interconnection region in the related art which is shown in FIG. 6 has a tendency to increase.

The predetermined gap L may be a distance with which one or more vias 11 can be arranged between the inner substrate pad array and the outer substrate pad array, and the predetermined gap L is optimally designed according to a trade-off between a magnitude of an impedance that increases due to the interconnection 7 on the semiconductor chip 1, which is necessary to enlarge the gap, and a magnitude of an impedance that decreases due to improvement in interconnection characteristics of the substrate. In addition, geometrically, the predetermined gap L is optimally designed in consideration of a ratio of the pad pitch p and the via diameter L1. For example, when the width of seven pads (effectively, six pads because two pads on both ends are common to adjacent interconnection regions), which are arranged in a staggered manner with the pitch p, is 6p, and the width is equal to the via diameter L1, if two vias 11_1 can be arranged on an inner side of the inner substrate pad array, two vias 11_2 can be arranged on an outer side of the outer substrate pad array, and two vias 11_3 can be arranged between the inner substrate pad array and the outer substrate pad array, the width of the interconnection region becomes 6p=L1, and becomes optimal. L=2×L1+3×L2 becomes optimal. Generally, when the diameter L1 of the via is N×p, L=N/3×L1+(N/3+1)×L2 becomes optimal, and thus even when employing a relatively larger distance L, the interconnection characteristics of the substrate are hardly improved. Rather, a problem of an increase in an impedance on a chip side due to the interconnection 7 for realizing the larger distance L becomes apparent.

As described above, according to the first embodiment, it is possible to improve the interconnection characteristics of the substrate 8 on which the semiconductor chip 1 is flip-chip mounted. Particularly, it is possible to improve the interconnection characteristics of a signal interconnection or power supply interconnection on the substrate.

Figure 8:
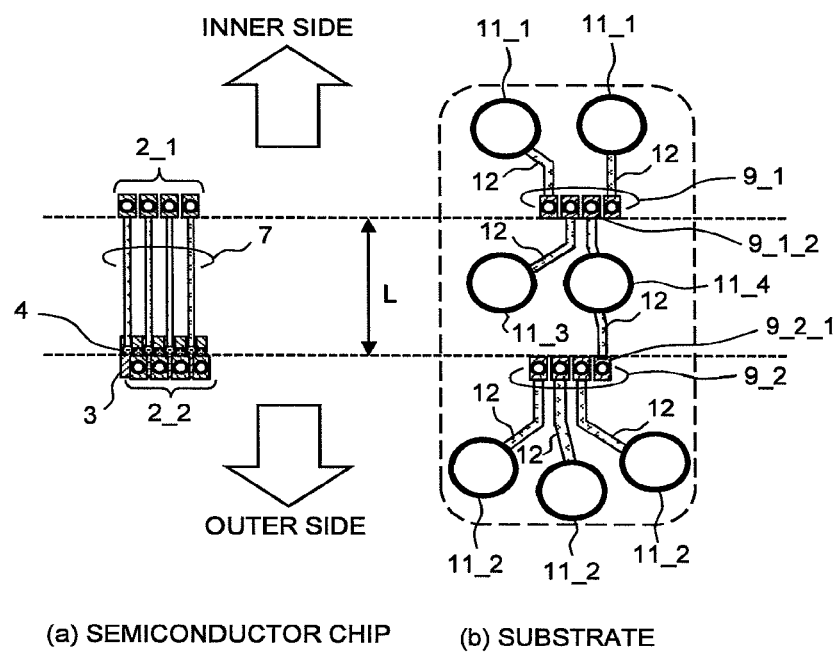
FIG. 8 is a layout diagram illustrating an arrangement example of the pads in the semiconductor chip according to the first embodiment, and another arrangement example of the substrate pads in the substrate on which the semiconductor chip is flip-chip mounted.

FIG. 8 shows a layout diagram illustrating an arrangement example of the pads 2_1 and 2_2 in the semiconductor chip 1 according to the first embodiment, and another arrangement example of the substrate pads 9_1 and 9_2 in the substrate 8 on which the semiconductor chip 1 is flip-chip mounted. Similar to FIG. 7, on a semiconductor chip 1 side shown in (a), an inner pad array that is constituted by a plurality of pads 2_1, and an outer pad array that is constituted by a plurality of pads 2_2 are spaced away from each other by the distance L and are arranged in a staggered manner. On a substrate 8 side shown in (b), an inner substrate pad array that is constituted by a plurality of substrate pads 9_1, an outer substrate pad array that is constituted by a plurality of substrate pads 9_2, and a plurality of vias 11 that are connected to the inner substrate pad array and the outer substrate pad array by interconnections 12 that lead out from the respective substrate pads are shown. In the example shown in FIG. 7, each of the substrate pads is interconnected to one of the vias 11. In contrast, in an example in FIG. 8, a substrate pad 9_2_1 and a substrate pad 9_1_2 are short-circuited by one of the interconnections 12, and a via 11_4 is provided between the substrate pads 9_2_1 and 9_1_2.

According to this, in the inner substrate pad array and the outer substrate pad array, in a case of the same signal, the pads 2_2_1 and 2_1_2, which are connected to adjacent input and output cells, short-circuit corresponding substrate pads 9_2_1 and 9_1_2 and share the via 11_4, and thus interconnection characteristics of the substrate can be further improved. Particularly, this is effective for a case in which all of the pads that are adjacent to each other are power supply pads or ground pads.

Second Embodiment

Gap Between Inner Pad and Outer Pad is Enlarged (Plated Interconnection)

With regard to the method of defining the predetermined distance L, an example different from the example described with reference to FIG. 5 will be described with reference to FIG. 9. The predetermined distance L is similarly defined in consideration of the interconnection characteristics in the substrate 8 on which the semiconductor chip 1 is flip-chip mounted, but particularly, the predetermined distance L is defined in consideration of interconnection characteristics of a plated interconnection.

Other configurations are the same as the configurations described in the first embodiment. The description with respect to FIGS. 1, 3, and 4 is true of the second embodiment as is.

Figure 9:
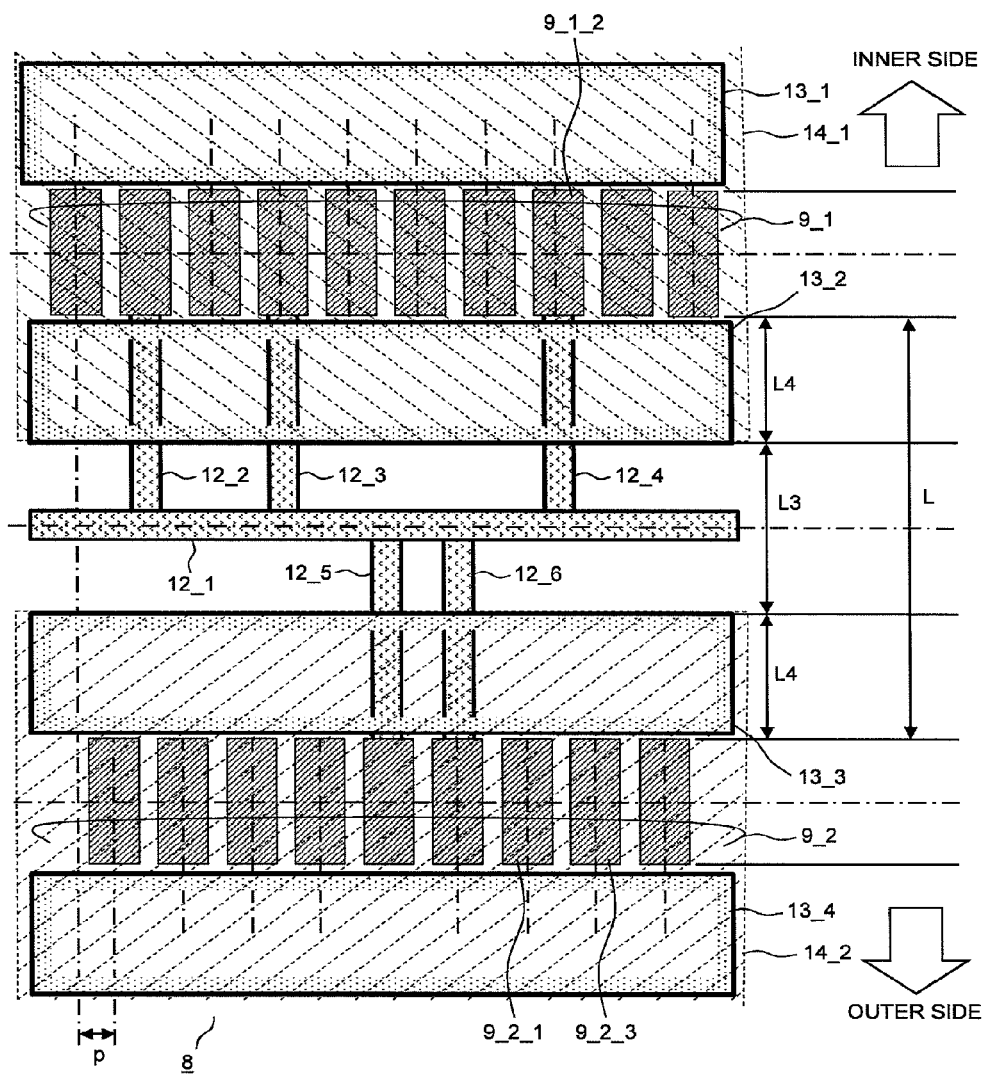
FIG. 9 is a layout diagram illustrating an arrangement of the substrate pads in the substrate on which the semiconductor chip according to the second embodiment is flip-chip mounted.

FIG. 9 shows a layout diagram illustrating an arrangement of substrate pads 9_1 and 9_2 in a substrate 8 on which a semiconductor chip 1 according to the second embodiment is flip-chip mounted.

An inner substrate pad array that is constituted by a plurality of substrate pads 9_1 that are connected to an inner pad array of the semiconductor chip 1, and an outer substrate pad array that is constituted by a plurality of substrate pads 9_2 that are connected to an outer pad array of the semiconductor chip 1 are arranged on the substrate 8. Several substrate pads 9_1 of the inner substrate pad array and several substrate pads 9_2 of the outer substrate pad array are short-circuited by interconnections 12_1 to 12_6. The interconnections 12_1 to 12_6 are plated interconnections, and additional interconnections 12 may be further provided to short-circuit all of the substrate pads.

The substrate 8 is covered with a resist film 13 except for on substrate pads 9 and the like. A resist film 13_1 is formed on an inner side of the inner substrate pad array and a resist film 13_4 is formed on the outer side of an outer substrate pad array. The interconnections 12_1 to 12_6 are plated interconnections, and thus it is necessary to remove a short-circuit portion by etching after an electrolytic plating treatment. An opening for etch-back of the plated interconnection 12_1 is provided in the resist films 13_2 and 13_3 between the inner substrate pad array and the outer substrate pad array. In a practical etch-back process, regions other than an object to be etched, which include the substrate pads 9_1 and 9_2, are covered with masks 14_1 and 14_2. The masks 14_1 and 14_2 are removed by a washing liquid and the like after the etch-back process.

The predetermined distance L is defined as a value equal to or greater than the sum of the minimum width L3 of the opening in the resist film and two times the minimum width L4 of the resist film itself.

According to this, it is possible to improve interconnection characteristics of the plated interconnections on the substrate. When all of the substrate pads 9_1 and 9_2 of four corners of the substrate 8, which correspond to four corners of the semiconductor chip 1, are arranged to be spaced away from each other by the same width L, the plated interconnection 12_1 that short-circuits all of the substrate pads 9_1 and 9_2 can be set to a layout that goes around four sides. Accordingly, it is not necessary to provide a plated interconnection on an opposite surface of the substrate 8. As a result, in a case where the substrate is, for example, a package substrate for BGA, it is possible to remove a region in which a BGA electrode cannot be arranged due to the plated interconnection. More BGA electrodes can be arranged in the same area, or it is possible to reduce the package size for arrangement of the same number of BGA electrodes.

Third Embodiment

Pad for Probing

In the first and second embodiments, description has been made with respect to an example in which the probing area 5 and the bonding area 6 are present on the same chip pad. Here, as described above, the probing area 5 is an area with which a probe is brought into contact so as to apply a test signal or to measure a signal that is output in the experiment on the semiconductor chip 1, and thus a pressing force is applied by pressing the probe during the experiment. A semiconductor chip of the related art may be disposed in a region of the input and output cells 3, or on a region spaced away from an internal circuit, and thus the pressing force by the probe is not applied to the internal circuit. However, as shown in the first and second embodiments, since the inner pad array is moved toward an inner side, that is, in a direction of a circuit forming region, the inner pad array may be arranged on the internal circuit. At this time, the pressing force due to the probe has an effect on the characteristics or operation of the internal circuit, and thus it is difficult to secure reliability or stable operation of a device. This is a new problem that occurs in the first and second embodiments. The third embodiment is one of configurations for solving the problem.

Figure 10:
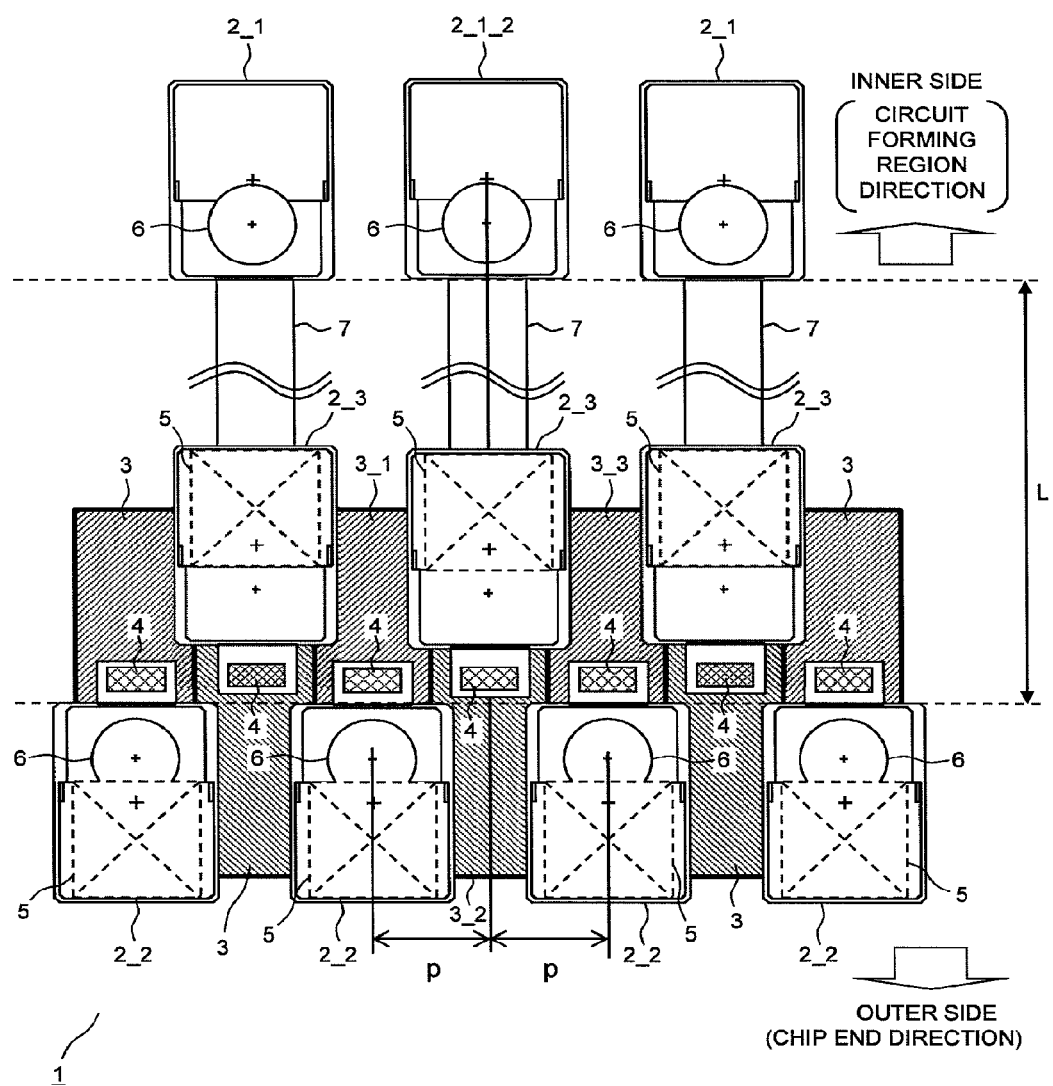
FIG. 10 is a layout diagram illustrating an arrangement of pads in a semiconductor chip according to a third embodiment.

FIG. 10 shows a layout diagram illustrating an arrangement of pads in a semiconductor chip according to the third embodiment.

Other configurations are the same as the configurations described in the first and second embodiments, and description with respect to FIGS. 1, 3, and 4 is true of the third embodiment. A semiconductor chip 1 according to the third embodiment further includes a pad 2_3 which is electrically connected to an input and output cell array 3_2 and which is arranged between a pad 2_1_2 and the input and output cell array on a side further inward in comparison to the input and output cell array.

The semiconductor substrate 8 on which the semiconductor chip 1 is flip-chip mounted includes the substrate pad 9_2_1 that faces and is connected to the pad 2_2_1, the substrate pad 9_1_2 that faces and is connected to the pad 2_1_2, and the substrate pad 9_2_3 that faces and is connected to the pad 2_2_3, but a substrate pad is not arranged at a position that faces a pad 2_3. The pad 2_3 is used only for probing, and the pad 2_1_2 is used only for bonding. In FIG. 10, all of three inner pads 2_1 have only the bonding area 6 without the probing area 5, and the pad 2_3 having only the probing area 5 without the bonding area 6 is provided. The pad 2_3 having only the probing area 5 without the bonding area 6 may be arranged in a region of the input and output cell 3, or on a region spaced away from the internal circuit.

According to this, it is possible to reduce damage during probing, and thus it is possible to prevent a problem of deterioration in device characteristics from occurring.

Among pads in the inner pad array, with respect to only a pad 2_1 that is arranged on a circuit that cannot permit a pressing force, a pad 2_3 having only the probing area 5 may be further provided, or the pad 2_3 having only the probing area 5 may be provided with respect to all of the pads in the inner pad array.

Fourth Embodiment

Chip Corner Portion

A configuration example of a chip corner portion in the semiconductor chip 1 of the first and second embodiment will now be described.

Figure 11:
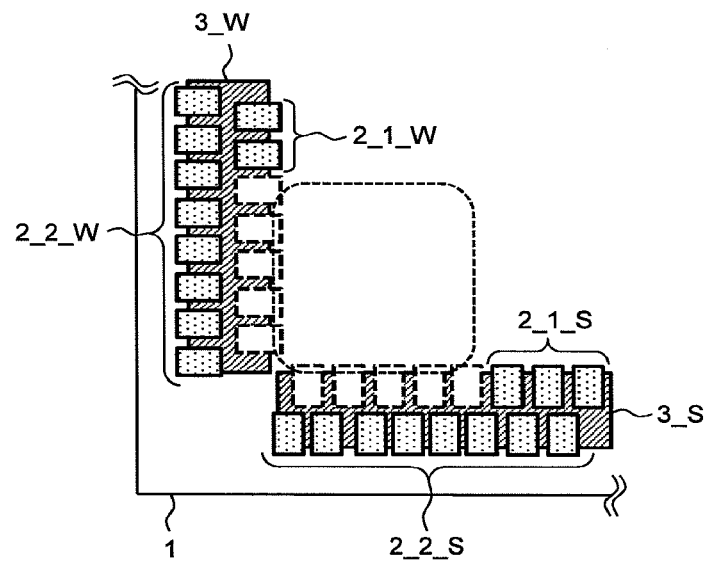
FIG. 11 is a layout diagram illustrating an arrangement of the pads at a corner portion of the semiconductor chip of the related art.
Figure 12:
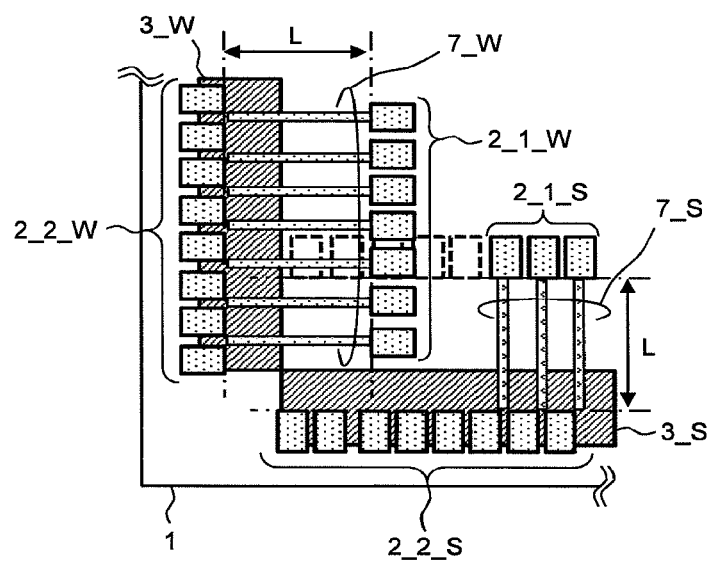
FIG. 12 is a layout diagram illustrating an arrangement of pads at a corner portion of a semiconductor chip according to a fourth embodiment.

FIG. 11 shows a layout diagram illustrating an arrangement of pads at a corner portion of a semiconductor chip of the related art, and FIG. 12 shows a layout diagram illustrating an arrangement of pads at a corner portion of a semiconductor chip according to a fourth embodiment.

FIGS. 11 and 12 show a lower-left corner portion of the semiconductor chip 1, and an input and output cell array 3_S of a lower side and an input and output cell array of a left side are arranged in directions perpendicular to each other. On a respective inner side and outer side, an inner pad array 2_1_S and an outer pad array 2_2_S, and an inner pad array 2_1_W and an outer pad array 2_2_W are arranged in a staggered manner, respectively. At the corner portion of the semiconductor chip of the related art which is shown in FIG. 11, for example, as described in JP-A-2008-252126, an arrangement of partial inner pads is prohibited to avoid congestion of interconnections in a substrate region that corresponds to a region surrounded by a dashed line. In FIG. 11, the inner pads 2_1 surrounded by a dashed line are pads that cannot be arranged due to prohibition of arrangement thereof.

FIG. 12 shows a configuration example of the chip corner portion in the semiconductor chip 1 according to the fourth embodiment. At the left side, an inner pad array 2_1_W is arranged to move toward an inner side by a predetermined distance L as in comparison to an outer pad array 2_2_W, and is interconnected to an input and output cell array 3_W by an interconnection 7. In contrast, in an inner pad array 2_1_S of a lower side, several pads 2_1 from the left end cannot be arranged in consideration of the inner pad array 2_1_W of the left side and an interconnection region in the substrate.

When comparing FIG. 11 and FIG. 12 with each other, in the related art, an arrangement of a total of 10 pads in the inner pad array is prohibited, but in the fourth embodiment, an arrangement of only 5 pads in the inner pad array of the lower side is prohibited. Accordingly, it is possible to increase the number of pads that can be arranged in the same chip area and in the same substrate area as in comparison to the related art.

FIG. 12 shows an example in which an arrangement of pads in the inner pad array is prohibited, but an arrangement of the same number of pads in the inner pad array may also be prohibited at both of the left side and the lower side. According to this, when being combined with the second embodiment, a connection of the plated interconnection of the left side and the plated interconnection of the lower side becomes easy. In the fourth embodiment, description has been made by exemplifying the lower-left corner portion. However, it is needless to say that the fourth embodiment is applicable to another corner portion in a similar manner, or that the fourth embodiment may be applied to all of four corners.

Fifth Embodiment

Mounting Type

The semiconductor chips 1 according to the first to fourth embodiments can constitute semiconductor devices of various mounting types in which each of the semiconductor chips 1 is flip-chip mounted on the substrate 8.

Figure 13:
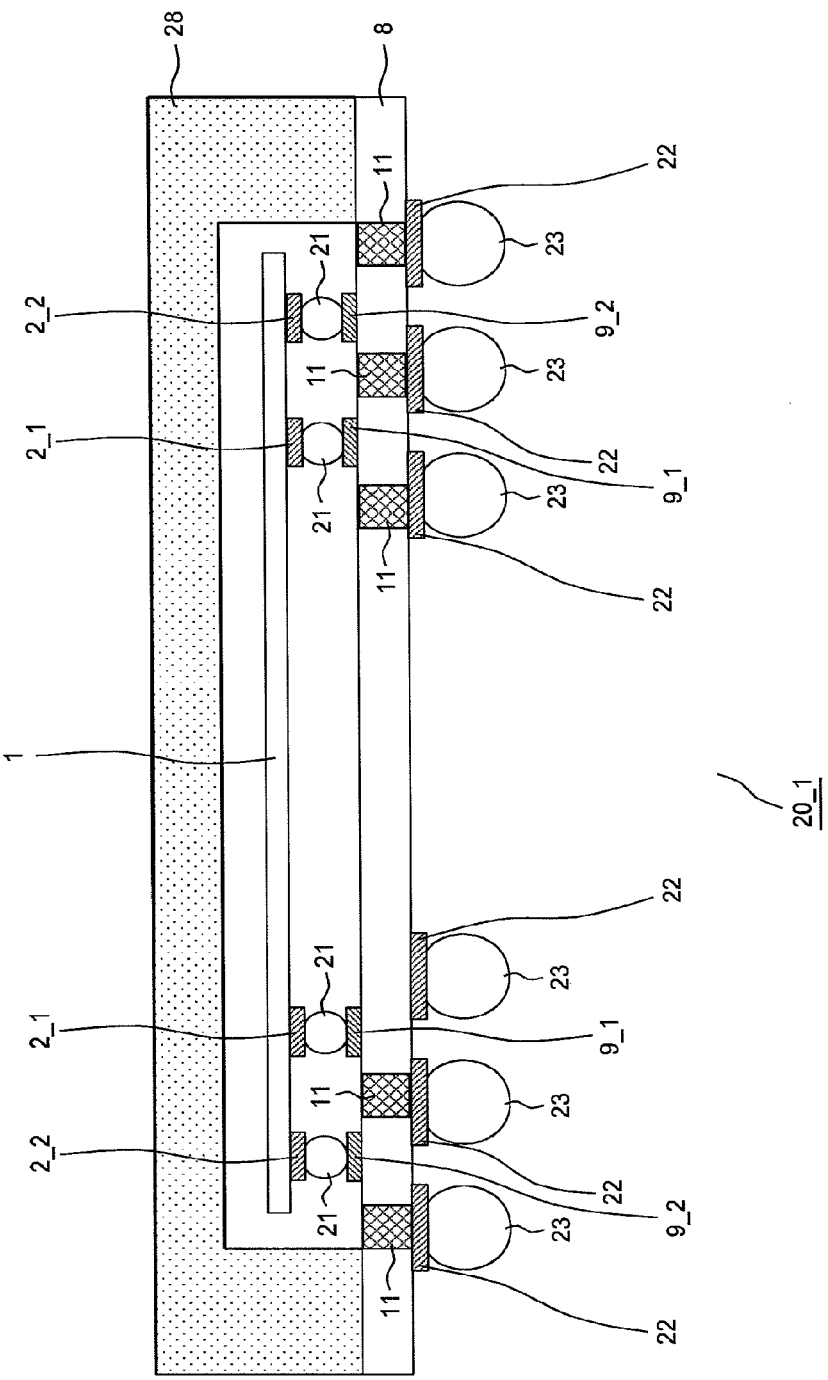
FIG. 13 is a schematic diagram illustrating an example of a mounting type of a BGA, which includes the substrate on which each of the semiconductor chips according to the first to fourth embodiments is flip-chip mounted, in a cross-sectional direction.

FIG. 13 shows a schematic diagram illustrating an example of a mounting type of a BGA 20_1, which includes the substrate 8 on which each of the semiconductor chips 1 according to the first to fourth embodiments is flip-chip mounted, in a cross-sectional direction. Each of the semiconductor chips 1 includes the outer pad array 2_2 and the inner pad array 2_1 that is arranged to be spaced away from the outer pad array 2_2 by the predetermined distance L. The substrate 8 includes the inner substrate pad array 9_1 and the outer substrate pad array 9_2 that are connected to the inner pad array 2_1 and the outer pad array 2_2 of the semiconductor chip 1, respectively, through the bump 21. The substrate 8 includes a BGA pad 22 on a surface opposite to a surface provided with the substrate pads 9_1 and 9_2, and a BGA electrode 23 that is connected to the BGA pad 22. The upper portion of the substrate 8 is sealed by a sealing material 28. For example, the sealing material 28 may be a ceramic provided with a resin or a metal lid, and the like.

According to this, in a semiconductor device 20_1 that is mounted on the BGA, it is possible to improve interconnection characteristics of the substrate 8. In the case of the second embodiment, the plated interconnection on a BGA pad surface may be omitted, and thus more BGA terminals 23 can be arranged on the same substrate area, or it is possible to suppress the area of the substrate 8 which is necessary to arrange a predetermined number of BGA terminals, that is, it is possible to reduce the size of a BGA package.

Figure 14:
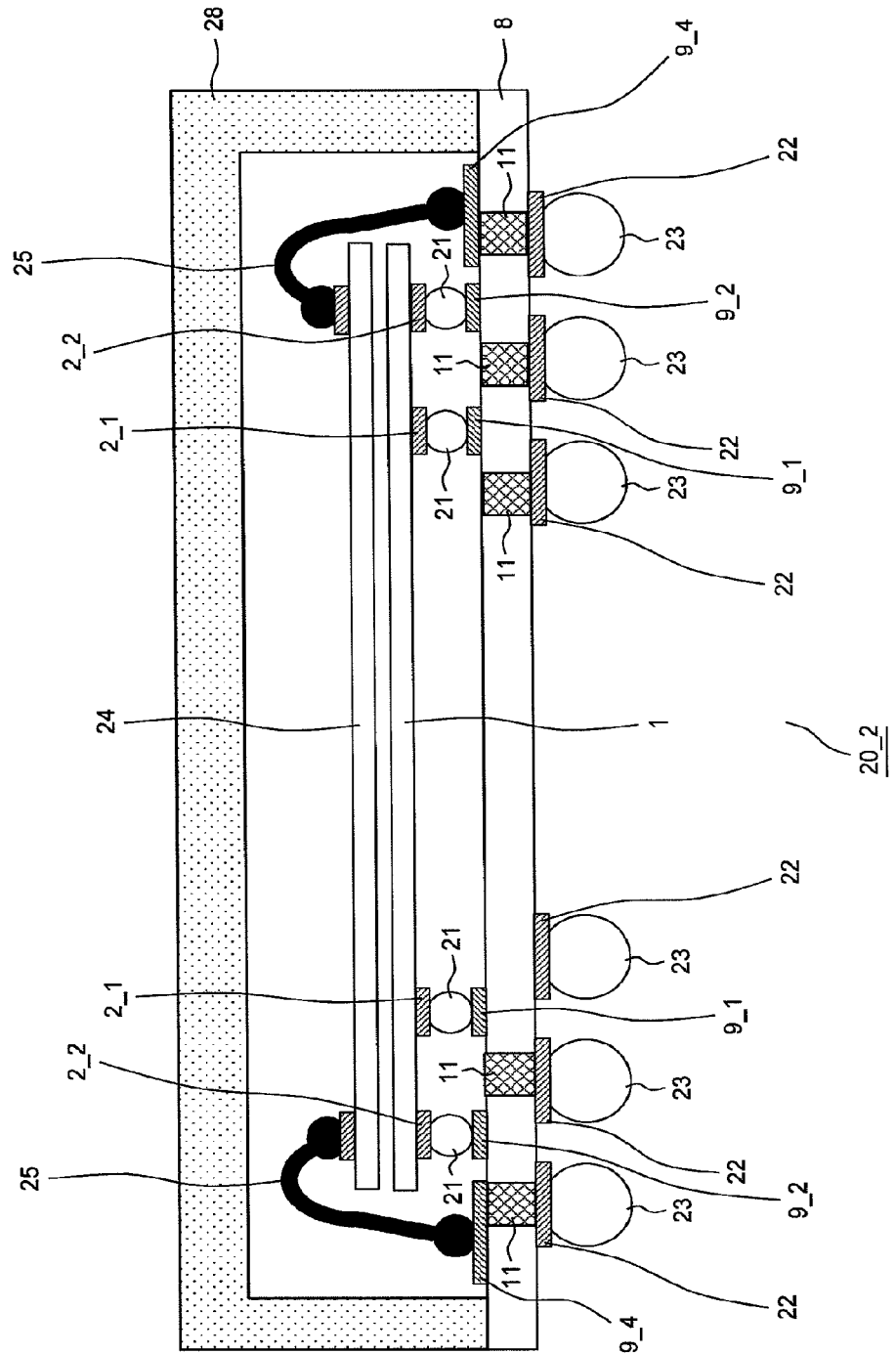
FIG. 14 is a schematic diagram illustrating an example of a mounting type of a System in Package (SiP), which includes the substrate on which each of the semiconductor chips according to the first to fourth embodiments is flip-chip mounted, in a cross-sectional direction.

FIG. 14 shows a schematic diagram illustrating an example of a mounting type of a System in Package (SiP) 20_2, which includes the substrate 8 on which each of the semiconductor chips 1 according to the first to fourth embodiments is flip-chip mounted, in a cross-sectional direction.

Similar to the configuration shown in FIG. 13, the semiconductor chip 1 includes the outer pad array 2_2 and the inner pad array 2_1 that is arranged to be spaced away from the outer pad array 2_2 by the predetermined distance L. The substrate 8 includes the inner substrate pad array 9_1 and the outer substrate pad array 9_2 that are connected to the inner pad array 2_1 and the outer pad array 2_2 of the semiconductor chip 1, respectively, through the bump 21. The substrate 8 includes the BGA pad 22 on a surface opposite to a surface provided with the substrate pads 9_1 and 9_2, and the BGA electrode 23 that is connected to the BGA pad 22. An electrode other than the BGA is also possible. Another semiconductor chip 24 is further stacked on the semiconductor chip 1. A substrate pad group 9_4 is further provided to the substrate 8 and is electrically connected to the semiconductor chip 24 with a bonding wire 25. The upper portion of the substrate 8 is sealed by a sealing material 28. For example, the sealing material 28 may be a ceramic provided with a resin or a metal lid, and the like.

For example, one application system, in which the semiconductor chip 1 is set as a microcomputer or system LSI that includes CPU and the semiconductor chip 24 is set as a memory, can be integrated in a single package.

According to this, it is possible to improve interconnection characteristics of the substrate in the SiP 20_2.

Figure 15:
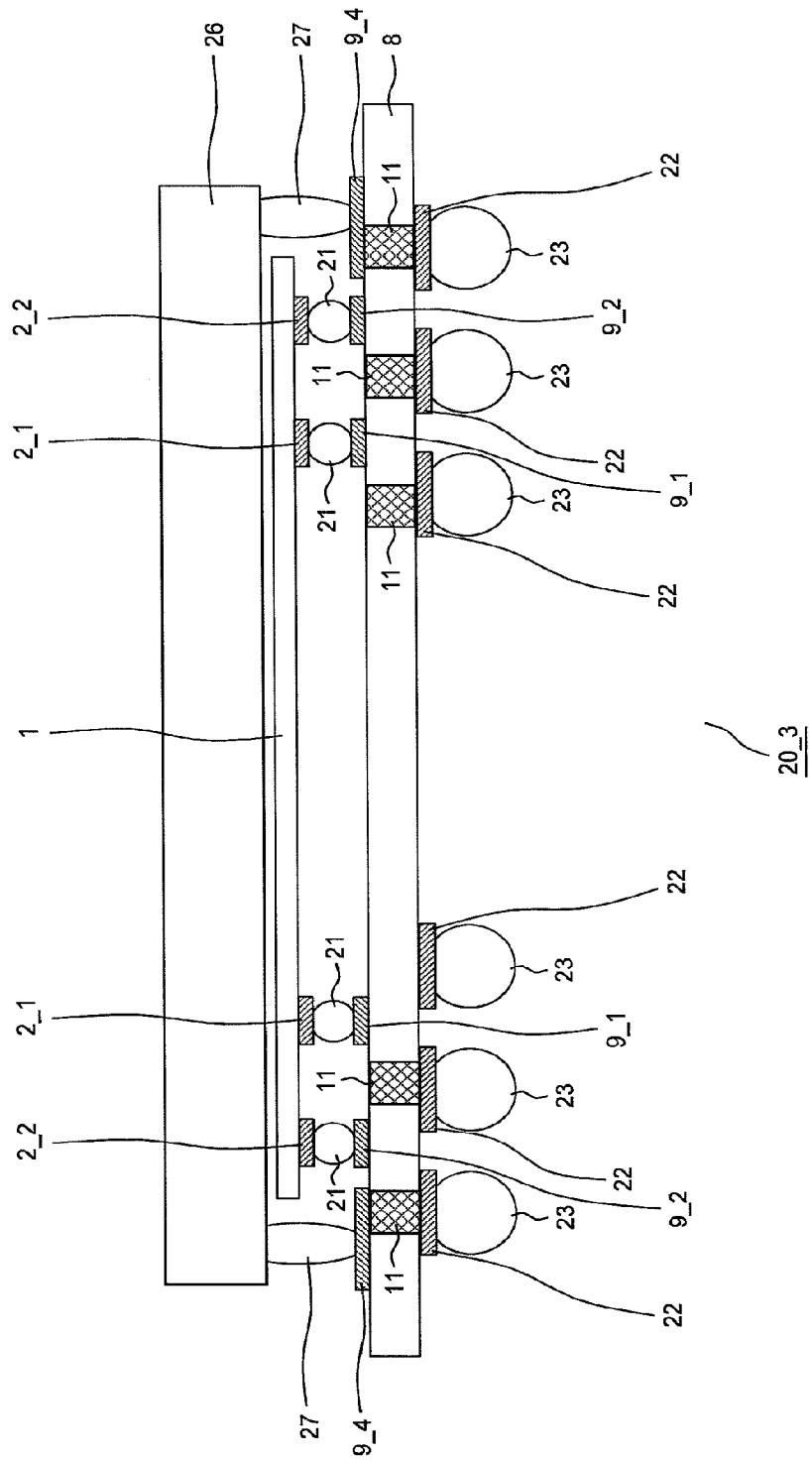
FIG. 15 is a schematic diagram illustrating an example of a mounting type of a Package on Package (PoP), which includes the substrate on which each of the semiconductor chips according to the first to fourth embodiments is flip-chip mounted, in a cross-sectional direction.

FIG. 15 shows a schematic diagram illustrating an example of a mounting type of a Package on Package (PoP) 20_3, which includes the substrate 8 on which each of the semiconductor chips 1 according to the first to fourth embodiments is flip-chip mounted, in a cross-sectional direction.

Similar to the configurations shown in FIGS. 13 and 14, the semiconductor chip 1 includes the outer pad array 2_2 and the inner pad array 2_1 that is arranged to be spaced away from the outer pad array 2_2 by the predetermined distance L. The substrate 8 includes the inner substrate pad array 9_1 and the outer substrate pad array 9_2 that are connected to the inner pad array 2_1 and the outer pad array 2_2, respectively, of the semiconductor chip 1 through the bump 21. The substrate 8 includes the BGA pad 22 on a surface opposite to a surface provided with the substrate pads 9_1 and 9_2, and the BGA electrode 23 that is connected to the BGA pad 22. An electrode other than the BGA is also possible. A semiconductor device 26, which includes a protrusion electrode 27 and is package-mounted, is stacked on the semiconductor chip 1. The substrate pad group 9_4 is further provided on the substrate 8 and is electrically connected to the semiconductor device 26 through the protrusion electrode 27.

The specifications of the protrusion electrode 27 and the substrate pad 9_4 that is connected to the protrusion electrode 27 can be determined, for example, according to standard specifications that are defined by JEDEC semiconductor technology association.

According to this, it is possible to improve interconnection characteristics of the substrate in the PoP 20_3.

Each of the semiconductor chips 1 according to the first to fourth embodiments can be directly mounted on a printed substrate as a bare chip without employing specific mounting types exemplified in FIGS. 13 to 15.

Figure 16:
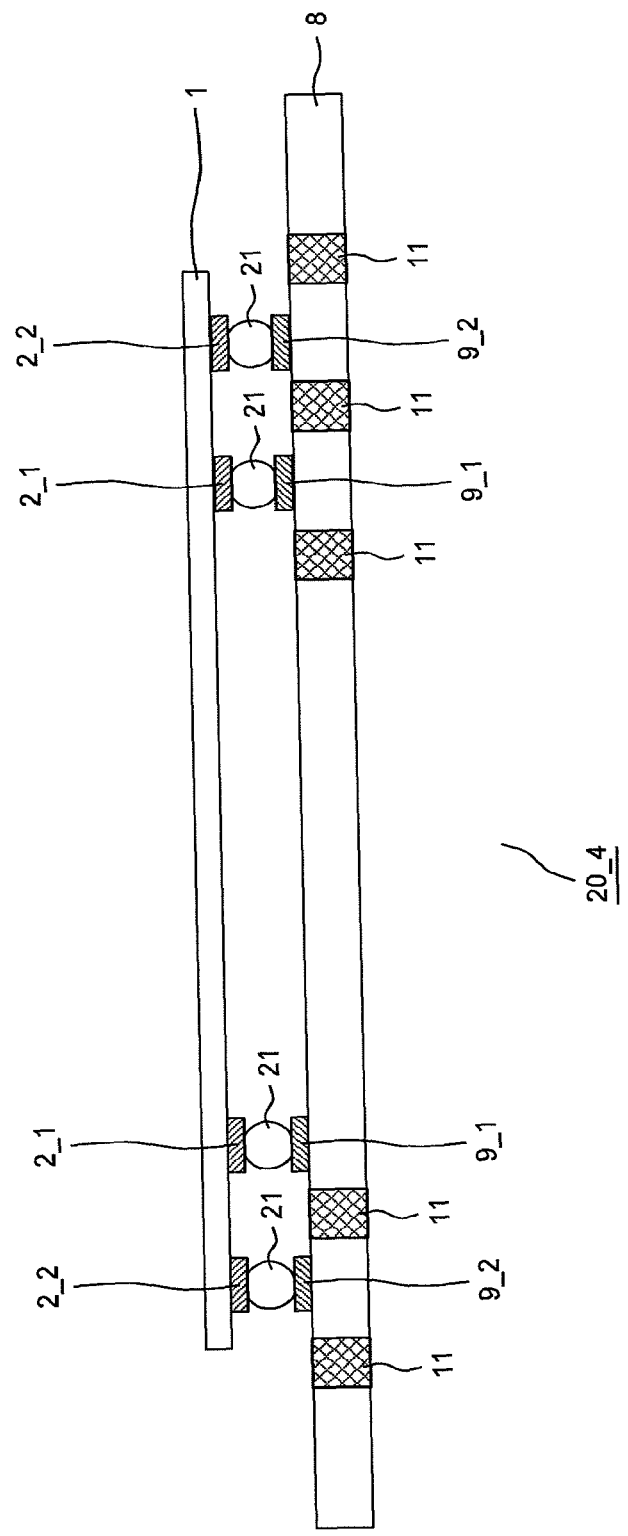
FIG. 16 is a schematic diagram illustrating an example of a mounting type in a cross-sectional direction in a circuit substrate on which each of the semiconductor chips according to the first to fourth embodiments is flip-chip mounted as a bare chip.

FIG. 16 shows a schematic diagram illustrating an example of amounting type in a cross-sectional direction in a circuit substrate (printed substrate) in which each of the semiconductor chips according to the first to fourth embodiments is flip-chip mounted on a substrate as a bare chip.

Similar to the configurations shown in FIGS. 13 to 15, the semiconductor chip 1 includes the outer pad array 2_2 and the inner pad array 2_1 that is arranged to be spaced away from the outer pad array 2_2 by the predetermined distance L. The substrate 8 includes the inner substrate pad array 9_1 and the outer substrate pad array 9_2 that are connected to the inner pad array 2_1 and the outer pad array 2_2 of the semiconductor chip 1, respectively, through the bump 21. Here, the substrate 8 can be configured as a printed substrate on which another semiconductor chip is mounted as a bare chip or another semiconductor chip that is packaged or on which other discrete components are mounted. In addition, a multi-chip module, in which another such component is mounted, and an electrode is provided on a front surface or a rear surface, can be configured.

Sixth Embodiment

Number of Substrate Pads Per One Solder Resist Opening is Limited

In a case of constituting the semiconductor device 20 by flip-chip mounting the semiconductor chip 1 according to the first embodiment on the corresponding substrate 8, there is a concern that reliability of the semiconductor device 20 may decrease under arbitrary conditions according to a flip-chip mounting method. First, this new problem will now be described.

Figure 17:
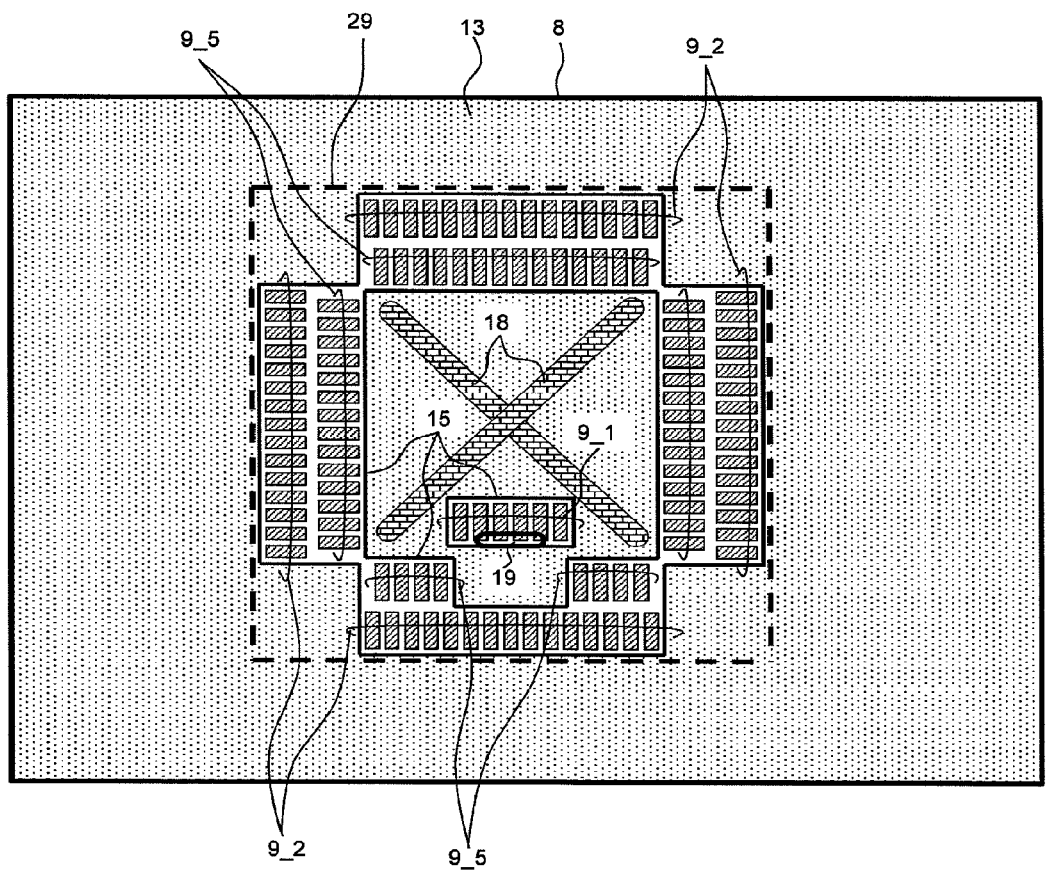
FIG. 17 is an explanatory diagram with respect to a new problem.
Figure 18:
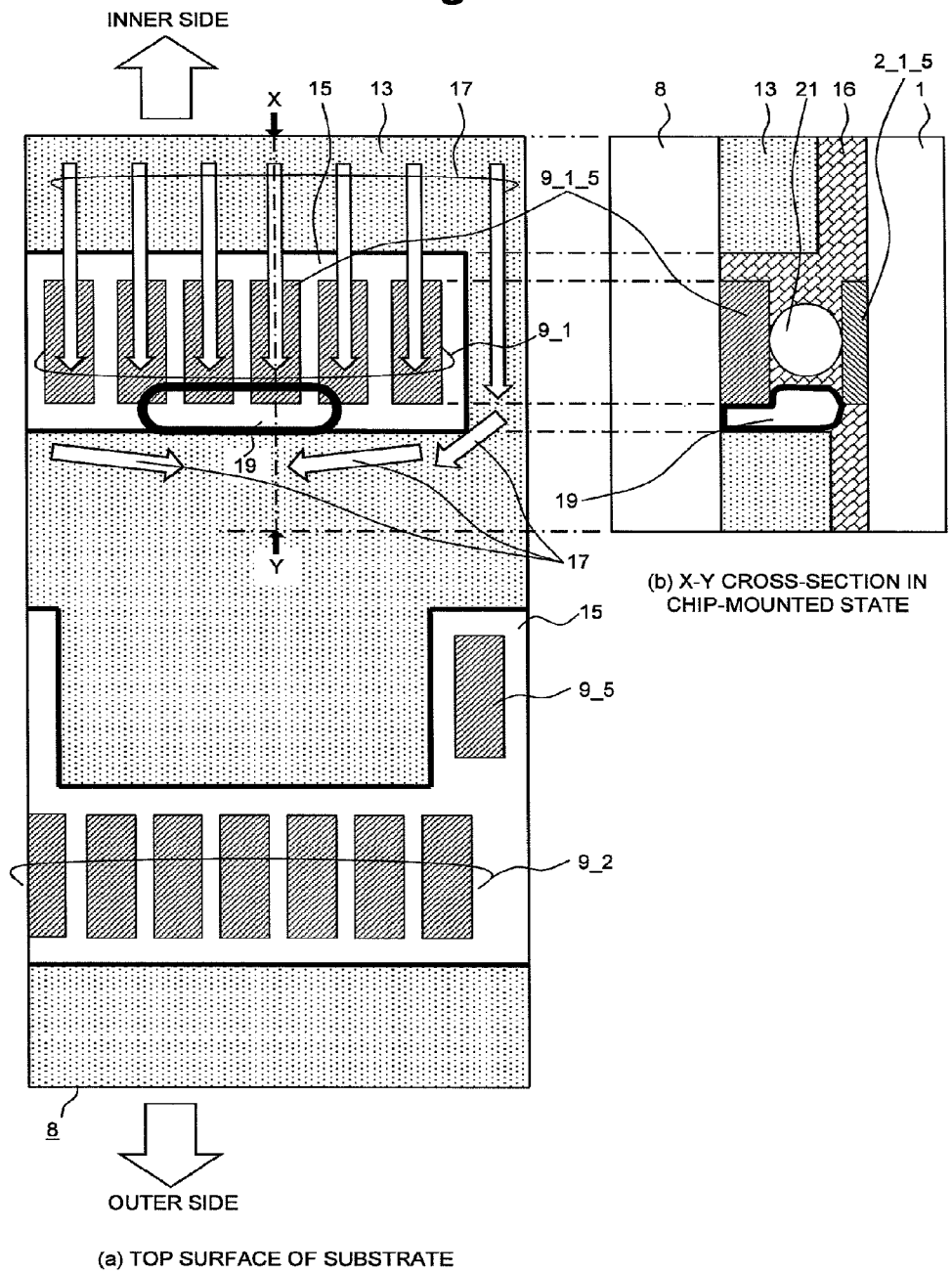
FIG. 18 is a more detailed explanatory diagram with respect to the new problem.

FIG. 17 shows an explanatory diagram with respect to the new problem, and FIG. 18 shows a more detailed explanatory diagram.

FIG. 17 shows a top view of the substrate 8 on which the semiconductor chip 1 according to the first embodiment is flip-chip mounted. A layer of a solder resist 13 is formed on a surface of the substrate 8. An opening 15 of the solder resist 13 is formed in a region of a position 29 at which the semiconductor chip 1 is mounted. Substrate pads 9_1, 9_2, and 9_5 are exposed on the surface. For example, the substrate pads 9_1, 9_2, and 9_5 constitute substrate pad arrays of pads that are connected to the same array of input and output cells 3 as the pads 2_1, 2_2, and 2_5 of the semiconductor chip 1, which face the substrate pads 9_1, 9_2, and 9_5, at the same side. The substrate pads 9_2 constitute an outer substrate pad array, the substrate pads 9_5 constitute the same inner substrate pad array as the related art, and the substrate pads 9_1 constitute the inner substrate pad array according to the first embodiment. The outer substrate pad array constituted by the substrate pads 9_2 and the inner substrate pad array constituted by the substrate pads 9_1 are arranged according to the positional relationship described in the above-described first embodiment. In a process of mounting the semiconductor chip 1, first, a liquid curable resin 16 is applied onto the substrate 8 in a liquid state having viscosity. This process is called pre-application. In FIG. 17, the liquid curable resin 16 is pre-applied to the vicinity of the center of the mounting position 29 of the semiconductor chip 1, for example, in an X shape shown as a pre-application region 18. Then, the semiconductor chip 1 is flip-chip mounted to overlap with the mounting position 29, and then bonding of the semiconductor chip 1 is carried out by compression. After the flip-chip mounting, the liquid curable resin is cured and becomes an underfill 16.

When employing this flip-chip mounting method, at the solder resist opening 15 surrounding the substrate pads 9_1 that constitute the inner substrate pad array, an air bubble (referred to as "void") 19 may remain under arbitrary conditions in the underfill 16 obtained by curing the liquid curable resin. In a case where the void 19 is formed over a plurality of substrate pads 9, there is a concern that the reliability of the semiconductor device 20 may deteriorate. For example, there is a concern that the substrate pads may be oxidized or corroded in the void 19, and thus a short-circuit path may be formed.

An occurrence principle of the void 19 will be described with reference to FIG. 18.

FIG. 18 shows a more detailed explanatory diagram with respect to the new problem. FIG. 18 includes a top view (a) of the substrate 8 in which the vicinity of a portion at which the void 19 occurs is enlarged, and a cross-sectional view (b) illustrating an X-Y cross-section that is a site at which the void 19 occurs. As shown in (b) of FIG. 18, in the X-Y cross-section, the layer of the solder resist 13 and a substrate pad 9_1_5 is formed on the substrate 8, and the substrate pad 9_1_5 is arranged in the opening 15 of the solder resist 13. The substrate pad 9_1_5 is connected to the pad 2_1_5 of the semiconductor chip 1, which faces the substrate pad 9_1_5, through the bump 21. The underfill 16 obtained by curing the liquid curable resin 16 is formed between the semiconductor chip 1 and the substrate 8. The underfill 16 has a function of bonding the semiconductor chip 1 and the substrate 8, and a function of preventing moisture from intruding into a connection portion between the substrate pads 9 and the pads of the semiconductor chip 1 from the outside, thereby maintaining reliability of the semiconductor device 20.

When the semiconductor chip 1 is compressed after the liquid curable resin 16 is pre-applied, a flow of the liquid curable resin 16 is shown in the top view (a) by an arrow 17. The pre-application region 18 is in the vicinity of the center of the mounting position 29, and is located in an upward direction in FIG. 18. The liquid curable resin 16 is forced to flow from an inner side to an outer side. At this time, a flow velocity of the liquid curable resin 16 that passes through the opening 15 of the solder resist 13 becomes slower than that of the liquid curable resin 16 that passes through the side of the opening 15. It is necessary for the liquid curable resin 16 passing through the opening 15 to overcome a difference between a step of the opening 15 and a step of the substrate pad 9_1_5. When the flow of the liquid curable resin 16, which passes through the side of the opening 15 and goes around to the outer side of the opening 15, reaches the outer side of the opening 15 more quickly than the flow of the liquid curable resin 16 that passes through the opening 15, an escape route of air, which is pushed out by the liquid curable resin 16 passing through the opening 15 at the end of the opening 15, is cut off, and thus the air is trapped. The trapped air becomes the air bubble, that is, the void 19, and the trapped air remains in the underfill 16 even after the liquid curable resin is cured.

The size of the void 19 is determined depending on the amount of air that is pushed out by the liquid curable resin 16 that passes through the opening 15, and the amount of air is defined by the size of the opening 15, that is, the number of the substrate pads 9 that are arranged in the opening 15. Accordingly, when a large opening is provided so as to surround a number of substrate pads 9, there is a concern that the void 19 is enlarged, and reaches the substrate pads 9 from an edge of the opening 15, or the void 19 may have a size that spans a plurality of the substrate pads 9. In a case where the void 19 spans the plurality of substrate pads 9, oxidation or corrosion of the substrate pad or the pads of the semiconductor chip progresses in the void 9, and thus failure such as a short-circuit due to an oxide may be caused, whereby reliability of the semiconductor device 20 deteriorates.

This problem occurs at the opening 15 of the inner substrate pad array in a case where the inner substrate pad array is moved from the outer substrate pad array toward an inner side as in comparison to the related art, and the inner substrate pad array is arranged in solder resist openings 15 different from each other as shown in the first embodiment.

The following solving means including three methods that are broadly classified may be employed to solve the new problem.

First solving means is based on a technical idea of subdividing the solder resist opening 15 to reduce an amount of air to be pushed out, thereby suppressing the size of the void 19 that occurs. The first solving means will be described in detail in a sixth embodiment.

Second solving means is based on a technical idea of increasing a flow velocity of the liquid curable resin 16 that passes through the opening 15, thereby removing a difference with the flow velocity of the liquid curable resin 16 that goes around from the side of the opening 15. The second solving means will be described in detail in the following seventh to ninth embodiments.

Third solving means is based on a technical idea of delaying the liquid curable resin 16 going around from the side of the opening 15 from reaching the outer side of the opening to reduce an amount of air that is trapped, thereby suppressing the size of the void 19 that occurs. The third solving means will be described in detail in the following tenth embodiment.

The technical ideas described in the sixth to tenth embodiments can be combined with each other, and combination with the above-described first to fifth embodiments are arbitrary.

First, the first solving means will be described below in detail as the sixth embodiment 6.

Figure 19:
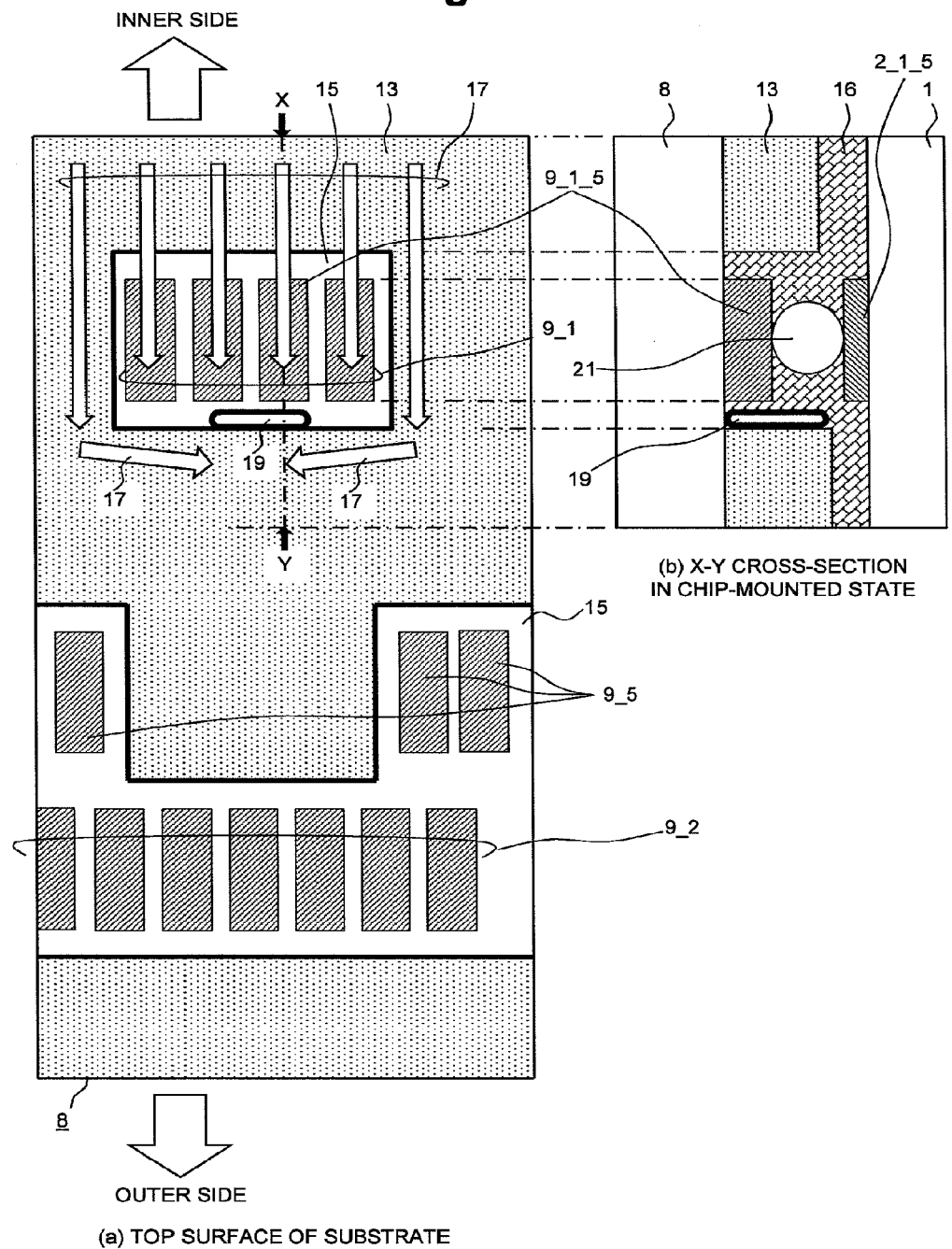
FIG. 19 is a schematic diagram illustrating a mounted state of a semiconductor device, in which a semiconductor chip according to a sixth embodiment is flip-chip mounted on a substrate, in a planar direction and a cross-sectional direction.

FIG. 19 shows a schematic diagram illustrating a mounted state of a semiconductor device 20, in which a semiconductor chip 1 according to the sixth embodiment is flip-chip mounted on the substrate 8, in a planar direction and a cross-sectional direction. Similar to the configuration shown in FIGS. 17 and 18, the semiconductor chip 1 is flip-chip mounted on the substrate 8 with the liquid curable resin 16 interposed therebetween. Similar to FIG. 18, (a) of FIG. 19 is a top view of the substrate 8, and (b) of FIG. 19 is a cross-sectional view of a chip-mounted state. (b) is a cross-sectional view illustrating an X-Y cross-section that is a site at which the void 19 occurs. In an X-Y cross-section, the layer of the solder resist 13 and the substrate pad 9_1_5 are formed on the substrate 8, and the substrate pad 9_1_5 is arranged in the opening 15 of the solder resist 13. The substrate pad 9_1_5 is connected to the pad 2_1_5 of the semiconductor chip 1, which faces the substrate pad 9_1_5, through the bump 21. The underfill 16 obtained by curing the liquid curable resin 16 is formed between the semiconductor chip 1 and the substrate 8.

Although not shown in FIG. 19, similar to FIG. 1, the semiconductor chip 1 includes a first pad array 2_2 (outer pad array), a second pad array 2_1 (inner pad array relating to the first embodiment), and a third pad array 2_5 (inner pad array similar to the related art). In the first pad array 2_2, a plurality of pads including a first pad 2_2_1 and a third pad 2_2_3 are adjacent to each other, and are linearly arranged in parallel with input and output cell arrays 3_1 to 3_3 on a side further outward in comparison to the input and output cell arrays 3_1 to 3_3. In the second pad array 2_1, a plurality of pads including a second pad 2_1_2 are adjacent to each other, and are linearly arranged in parallel with the input and output cell arrays 3_1 to 3_3 on a side further inward in comparison to the input and output cell arrays 3_1 to 3_3. In the third pad array 2_5, a plurality of pads including the second pad 2_1_2 are adjacent to each other, and are linearly arranged in parallel with the input and output cell arrays 3_1 to 3_3 on a side further inward in comparison to the input and output cell arrays 3_1 to 3_3 and on a side further outward in comparison to the second pad array 2_1.

The substrate 8 includes the solder resist 13, a first substrate pad array 9_2, a second substrate pad array 9_1, and a third substrate pad array 9_5. The first substrate pad array 9_2, the second substrate pad array 9_1, and the third substrate pad array 9_5 are constituted by a plurality of substrate pads that face and are connected to the plurality of pads that constitute the first pad array 2_2, the second pad array 2_1, and the third pad array 2_5 of the semiconductor chip 1, respectively. Similar to the description with reference to FIG. 17, the first substrate pad array 9_2 is the outer substrate pad array, the third substrate pad array 9_5 is the inner substrate pad array similar to the related art, and the second substrate pad array 9_1 is the inner substrate pad array relating to the first embodiment. The solder resist 13 may be provided to a surface of the substrate 8 on a side on which the semiconductor chip 1 is flip-chip mounted, and the solder resist opening 15 is provided in a region in which a plurality of substrate pads that constitute the first substrate pad array 9_2, the second substrate pad array 9_1, and the third substrate pad array 9_5 are arranged. The substrate pads that are arranged closely to each other are included in the same solder resist opening 15. In FIG. 19, the second substrate pad array 9_1 that is constituted by four substrate pads is arranged in one solder resist opening 15, the third substrate pad array 9_5 that is constituted by three substrate pads and the first substrate pad array 9_2 that is constituted by seven substrate pads are arranged in another solder resist opening 15.

On the second substrate pad array 9_1 side (inner substrate pad array side), the number of substrate pads 9 that are arranged in the one solder resist opening 15 is calculated on the basis of parameters including a viscosity of the liquid curable resin 16 during flip-chip mounting, the thickness of the solder resist 13, and a gap between the semiconductor chip 1 and the substrate 8. For example, the number of the substrate pads 9 can be obtained by a fluid simulation in which the viscosity, the thickness, and the gap are input as parameters. Alternatively, the number of the substrate pads 9 can be experimentally obtained using, for example, a trial product in which the viscosity, the thickness, and the gap are set as parameters.

In the inner substrate pad array, when the number of the substrate pads 9 that are arranged in the one solder resist opening 15 is limited to be equal to or less than the number that is calculated, an amount of the air that is pushed out is reduced, and thus the size of the void 19 that occurs can be suppressed. FIG. 19 shows an example in which the number of the substrate pads 9 that are arranged in the one solder resist opening 15 is suppressed to four. In FIG. 19, the void 19 is suppressed to be smaller than the example shown in FIG. 18, whereby the void 19 does not reach the substrate pads 9_1_5 of the second substrate pad array 9_1. Oxidation or corrosion of the substrate pads 9_15 is prevented.

When the semiconductor device 20 employs the above-described configuration, even when the liquid curable resin 16 is pre-applied as an underfill, and then the semiconductor chip 1 is compressed and bonded to the substrate 8 to carry out flip-chip mounting, a large void that spans a plurality of substrate pads is not formed in the solder resist opening 15, and thus reliability of the semiconductor device 20 can be increased. In addition, in the semiconductor chip 1, a position at which the pads are arranged is determined on the assumption that the semiconductor chip 1 is mounted on the above-described substrate 8, and thus a large void that spans a plurality of substrate pads is not formed in the solder resist opening 15 of the semiconductor device 20 after being mounted, and thus it is possible to provide the semiconductor chip 1 capable of increasing the reliability.

In the inner substrate pad array, with regard to an arrangement method of the substrate pads 9 in which the number of the substrate pads 9 arranged in the one solder resist opening 15 is limited to be equal to or less than the number that is calculated, various embodiments are present.

Figure 20:
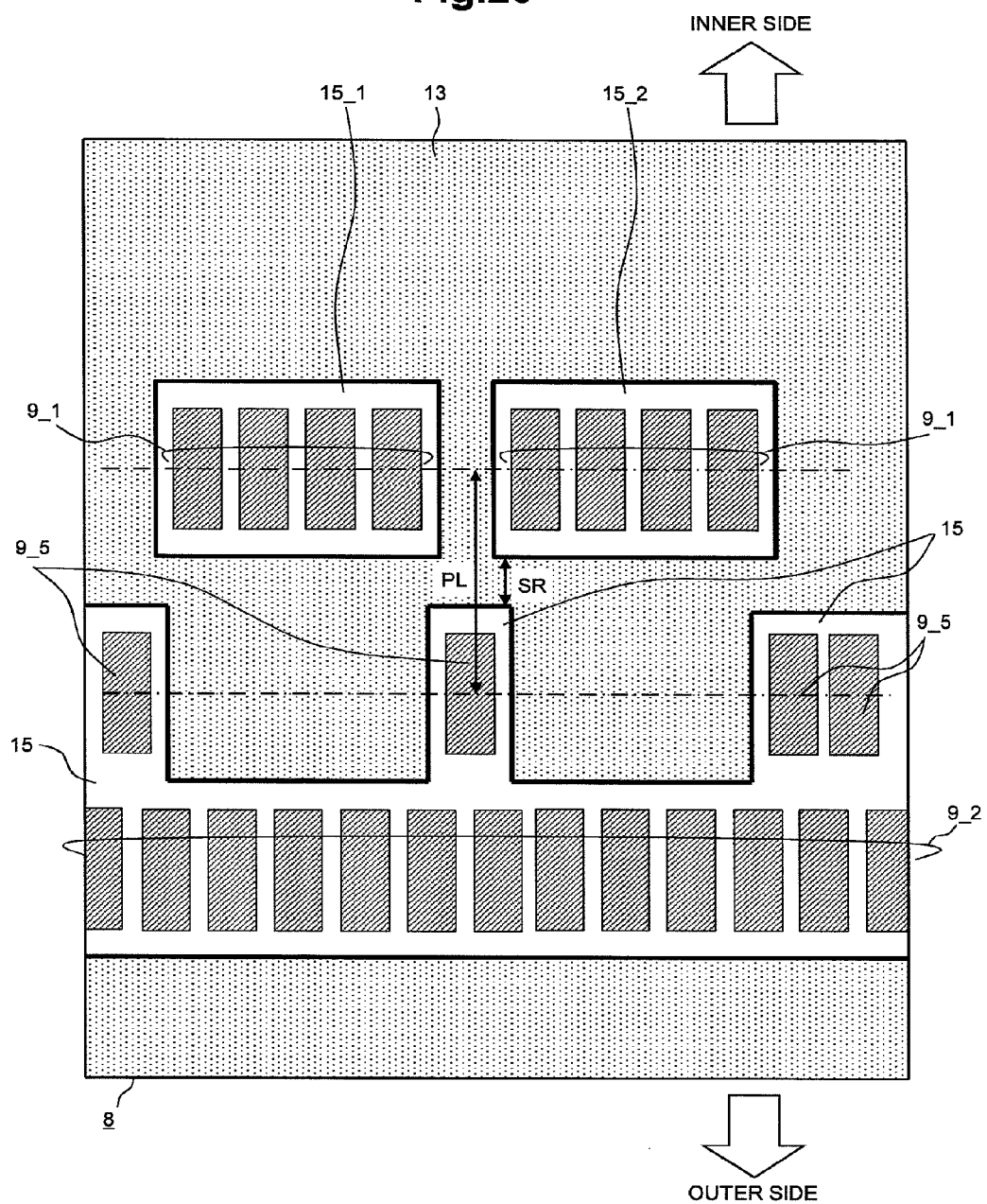
FIG. 20 is a layout diagram illustrating an example of an arrangement of substrate pads in the substrate of the semiconductor device according to the sixth embodiment.

FIG. 20 shows a layout diagram illustrating an example of arrangement of the substrate pads 9 in the substrate 8 of the semiconductor device 20 according to the sixth embodiment. Similar to FIG. 17, and (a) of FIGS. 18 and 19, FIG. 20 is a top view of the substrate 8. FIG. 20 shows an example in which in the inner substrate pad array, the number of the substrate pads 9 arranged in an opening 15_1 and the number of the substrate pads 9 arranged in an opening 15_2 are each limited to four, so as to limit the number of the substrate pads 9 that are arranged in the one solder resist opening 15 to a number equal to or less than the number that is calculated. FIG. 20 shows an example in which the substrate pad 9 arranged between the openings 15_1 and 15_2 is moved toward the third substrate pad array 9_5 side to separate the opening, thereby limiting the number of the substrate pads included in each of the openings 15_1 and 15_2 to four. A solder resist opening to expose the substrate pad 9 that is moved is formed in combination with the opening 15 for the outer substrate pad array. A gap SR between openings is set to, for example, 20 μm according to a design rule of the substrate 8, and a pitch PL between the two inner substrate pad arrays 9_1 and 9_5 may be set to, for example, 100 μm. The gap may be a distance with which one or more vias 11 can be arranged between the inner substrate pad array 9_1 and the outer substrate pad array 9_2 similar to the configuration described in the first embodiment. The gap SR is optimally designed according to a trade-off between a magnitude of an impedance that increases due to an interconnection on the semiconductor chip 1, which is necessary to enlarge the gap, and a magnitude of an impedance that decreases due to improvement in interconnection characteristics of the substrate. In addition, geometrically, the gap SR is optimally designed in consideration of a ratio of a pad pitch and a via diameter.

Figure 21:
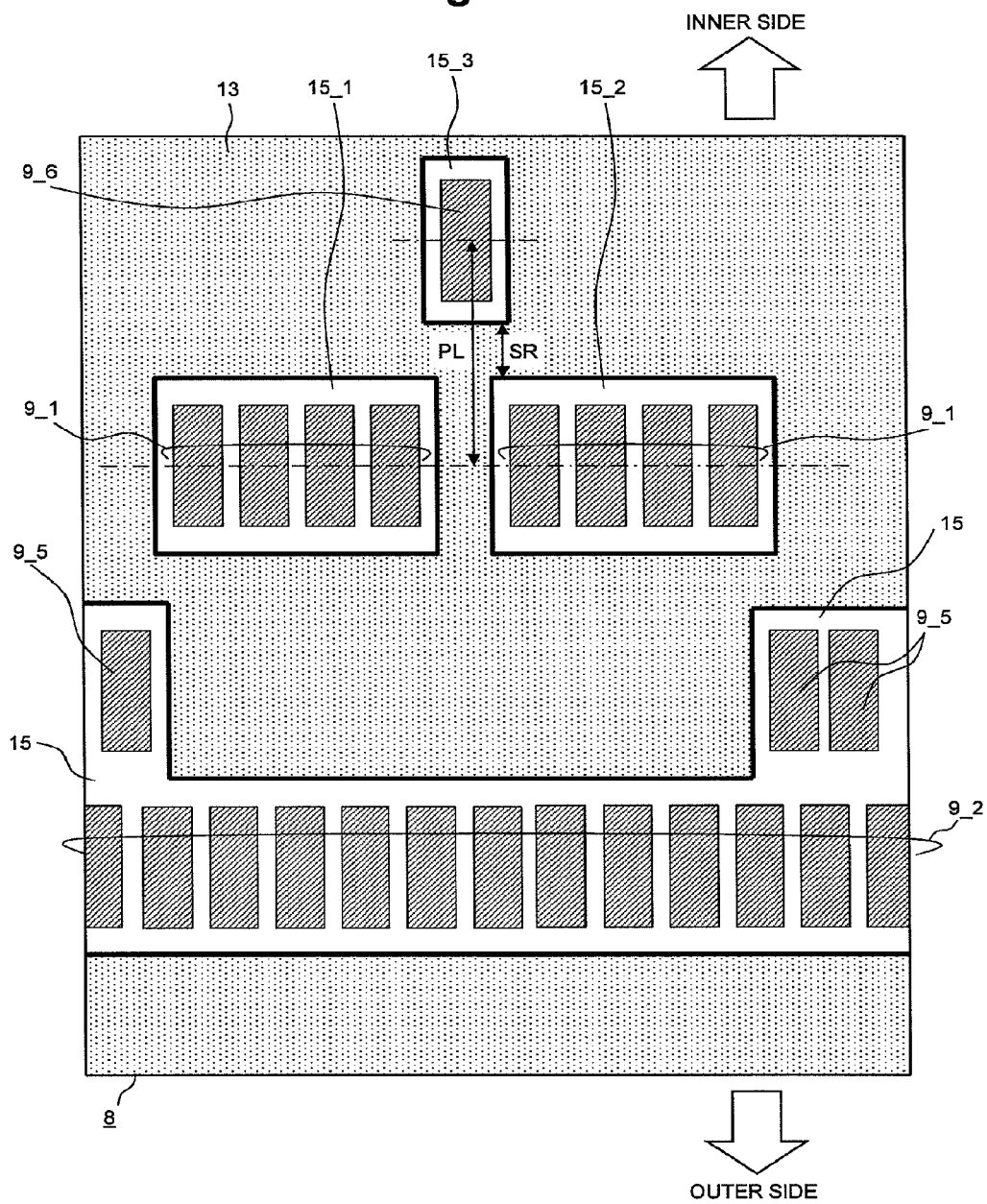
FIG. 21 is a layout diagram illustrating another example of the arrangement of the substrate pads in the substrate of the semiconductor device according to the sixth embodiment.

FIG. 21 shows a layout diagram illustrating another example of the arrangement of the substrate pads 9 in the substrate 8 of the semiconductor device 20 according to the sixth embodiment. Similar to FIG. 17, (a) of FIGS. 18 and 19, and FIG. 20, FIG. 21 is a top view of the substrate 8. FIG. 20 shows an example in which in the inner substrate pad array 9_1, the number of the substrate pads 9 arranged in the opening 15_1 and the number of the substrate pads 9 arranged in the opening 15_2 are each limited to four, so as to limit the number of the substrate pads 9 that are arranged in the one solder resist opening 15 to a number equal to or less than the number that is calculated. FIG. 21 shows an example in which a substrate pad 9_6 arranged between the openings 15_1 and 15_2 is further moved toward an inner side to separate the openings 15_1 and 15_2, thereby limiting the number of substrate pads included in each of the openings 15_1 and 15_2 to four. A solder resist opening 15_3 to expose the substrate pad 9_6 that is moved is independently formed. A gap SR between the openings 15_3 and the openings 15_1 and 15_2 is set to, for example, 20 μm according to a design rule of the substrate 8, and a pitch PL between the two inner substrate pad arrays 9_1 and the substrate pad 9_6 that is moved may be set to, for example, 100 μm. It is possible to secure a broad space between the inner pad arrays 9_1 and the outer substrate pad array 9_2 as in comparison to FIG. 20, and thus it is possible to increase the margin during an arrangement of a via on the substrate.

Figure 22:
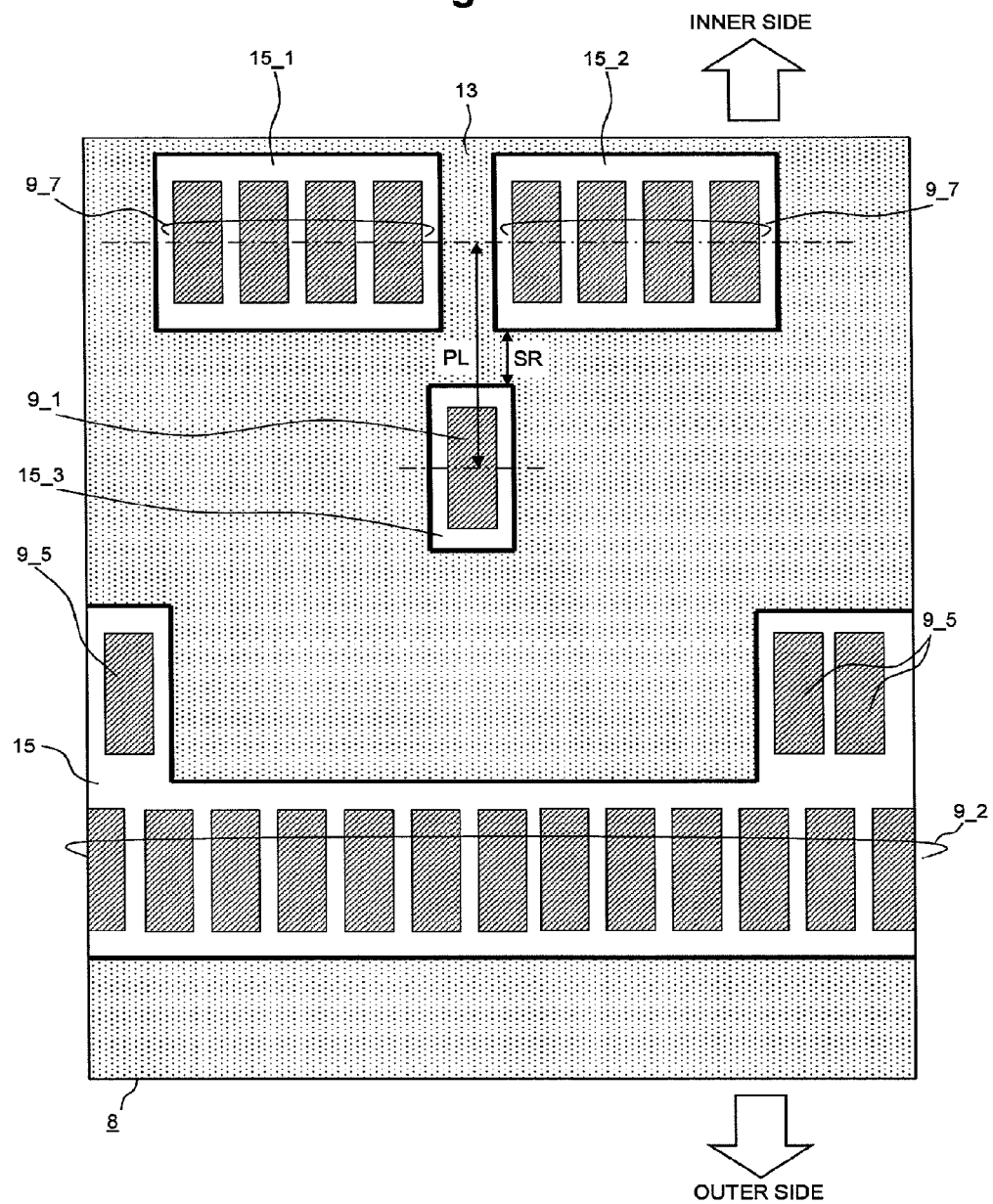
FIG. 22 is a layout diagram illustrating still another example of the arrangement of the substrate pads in the substrate of the semiconductor device according to the sixth embodiment.

FIG. 22 shows a layout diagram illustrating still another example of the arrangement of the substrate pads 9 in the substrate 8 of the semiconductor device 20 according to the sixth embodiment. Similar to FIG. 17, (a) of FIGS. 18 and 19, FIG. 20, and FIG. 21, FIG. 22 is a top view of the substrate 8. FIG. 22 shows an example in which in the inner substrate pad array, the number of substrate pads 9_7 arranged in the opening 15_1 and the number of the substrate pads 9_7 arranged in the opening 15_2 are each limited to four, so as to limit the number of the substrate pads 9 that are arranged in the one solder resist opening 15 to a number equal to or less than the number that is calculated. FIG. 22 shows an example in which substrate pads 9_7 at both sides are further moved toward an inner side while leaving one substrate pad 9_1 arranged between the openings 15_1 and 15_2 at the original position to separate the openings 15_1 and 15_2, thereby limiting the number of substrate pads included in each of the openings 15_1 and 15_2 to four. Solder resist openings 15_1, 15_2, and 15_3 that are separated are formed. A gap SR between the opening 15_3 and the openings 15_1 and 15_2 is set to, for example, 20 μm according to a design rule of the substrate 8, and a pitch PL between the two inner substrate pad arrays 9_7 that are moved and the substrate pad 9_1 is set to, for example, 100 μm. It is possible to secure a broad space between the inner substrate pad arrays 9_7 and the outer substrate pad array 9_2 as in comparison to FIG. 20, and thus it is possible to increase the margin during an arrangement of a via on the substrate.

Seventh Embodiment

Shape of Solder Resist Opening

Description will be made with respect to one of the embodiments based on the second solving means to solve the above-described new problem, that is, the technical idea of increasing a flow velocity of the liquid curable resin 16 that passes through the opening 15, thereby removing a difference with the flow velocity of the liquid curable resin 16 that goes around from the side of the opening 15.

Figure 23:
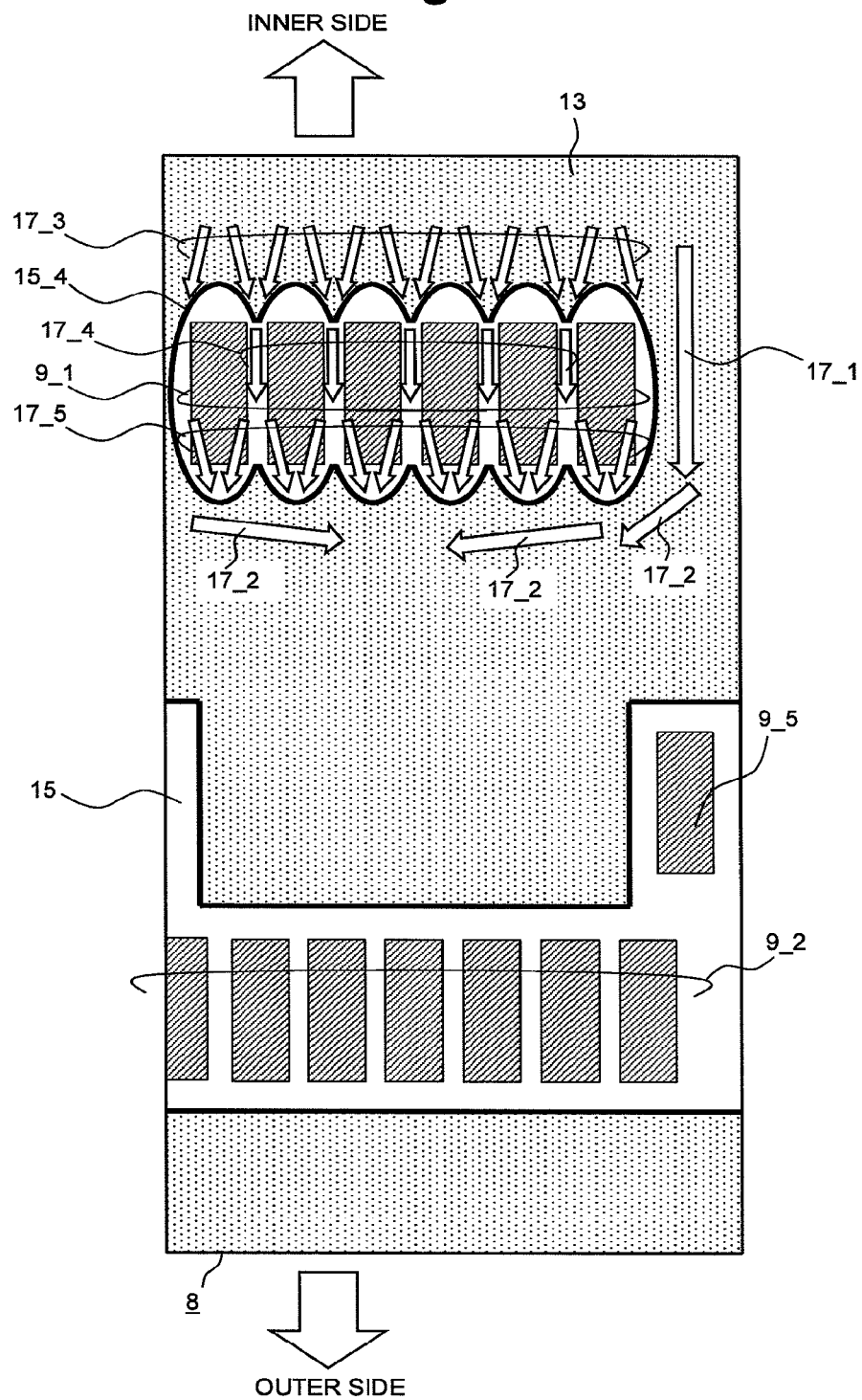
FIG. 23 is a layout diagram illustrating an example a shape of a solder resist opening in a substrate of a semiconductor device according to a seventh embodiment.

FIG. 23 shows a layout diagram illustrating an example a shape of a solder resist opening in a substrate of a semiconductor device according to a seventh embodiment. FIG. 23 is a top view of the substrate 8 similar to the FIG. 17, (a) of FIGS. 18 and 19, FIG. 20, FIG. 21, and FIG. 22. FIG. 23 shows an example in which in the inner substrate pad array, a shape of the opening 15 is considered instead of limiting the number of substrate pads 9 that are arranged in one solder resist opening 15.

Although not shown in FIG. 23, similar to FIGS. 1 and 19, the semiconductor chip 1 includes a first pad array 2_2 (outer pad array), a second pad array 2_1 (inner pad array relating to the first embodiment), and a third pad array 2_5 (inner pad array similar to the related art). The substrate 8 includes a solder resist 13, a first substrate pad array 9_2, a second substrate pad array 9_1, and a third substrate pad array 9_5. Respective configurations thereof are the same as the configurations described with reference to FIG. 19, and thus description thereof will not be repeated.

In FIG. 23, a second substrate pad array 9_1 (inner substrate pad array) that is constituted by six substrate pads is arranged in one solder resist opening 15_4, and a third substrate pad array 9_5 that is constituted by three substrate pads and a first substrate pad array 9_2 that is constituted by seven substrate pads are arranged in another solder resist opening 15. The solder resist opening 15_4 has a concave portion in a side that is far away from the first substrate pad array 9_2 (a side in an inward direction of the chip) at a position that faces a gap between a plurality of substrate pads 9_1. In addition, the solder resist opening 15_4 has a convex portion in a side that is close to the first substrate pad array 9_2 (a side in an outward direction of the chip) at a position that faces a side of each of the plurality of substrate pads 9_1. FIG. 23 shows an example in which the opening 15_4 is constituted by a curve, but the opening portion 15_4 may have a polygonal shape that is constituted by a bent line.

In FIG. 23, a flow 17 of the liquid curable resin 16 is indicated by an arrow. The pre-application region 18 is in the vicinity of the center of the mounting position 29, and is located in an upward direction in FIG. 23. The liquid curable resin 16 is forced to flow from an inner side to an outer side. As indicated by an arrow 17_3, the flow of the liquid curable resin 16 that passes through the opening 15_4 of the solder resist 13 is concentrated in the concave portion of a side of the solder resist opening 15_4 on an inward direction side. This is because the liquid curable resin 16, which is forced to flow from the inner side, first reaches convex portions rather than the concave portion, a flow velocity becomes slow due to a step difference of the solder resist 13, and thus the liquid curable resin 16 changes directions thereof toward the concave portion. The flow of the liquid curable resin 16 is concentrated in the concave portion, and flows through a gap between the substrate pads 9_1 as indicated by an arrow 17_4. At this time, since the flow is concentrated, the flow velocity does not become slow as in comparison to the liquid curable resin 16 that passes through the side of the opening 15 as indicated by arrows 17_1 and 17_2, or a degree of slowness is further mitigated as in comparison to the example shown in FIG. 18. Further, at a side of the solder resist opening 15_4 on an outward direction side, the flow of the liquid curable resin 16 is concentrated in a convex portion that faces each side of the plurality of substrate pads 9_1 as indicated by an arrow 17_5. This is because the liquid curable resin 16 overcomes a step difference of the solder resist 13 and thus the flow velocity becomes slow. As a result, the flows 17_3, 17_4, and 17_5 of the liquid curable resin 16, which passes through the opening 15_4, have approximately the same velocity as that of the flows 17_1 and 17_2 of the liquid curable resin 16 that passes through the side of the opening 15_4 and goes around to the outer side of the opening 15_4, or even when slower, a degree of slowness is further mitigated as in comparison to the example shown in FIG. 18, and thus it is possible to reduce an amount of air that is pushed out to an end of the opening 15_4 and is trapped due to cutting-off of an escape route. In addition, air that is trapped is also dispersed to the respective convex portions, and thus a position at which the void 19 is formed is also dispersed to the respective convex portions. Accordingly, the problem in that the void 19 is formed over plurality of substrate pads 9 can be prevented, or even when the problem occurs, probability thereof is greatly reduced. As a result, it is possible to increase the number of the substrate pads 9_1 that can be included in one opening 15_4 as in comparison to the sixth embodiment.

According to this, even when the liquid curable resin 16 is pre-applied as an underfill, and then the semiconductor chip 1 is compressed and bonded to the substrate 8 to carry out flip-chip mounting, a large void 19 that spans a plurality of substrate pads is not formed in the solder resist opening 15, and thus reliability of the semiconductor device 20 can be increased.

Eighth Embodiment

Gap Between Substrate Pads in Solder Resist Opening is Narrowed

Description will be made with respect to another embodiment of the embodiments based on the second solving means to solve the above-described new problem, that is, the technical idea of increasing a flow velocity of the liquid curable resin 16 that passes through the opening 15, thereby removing a difference with the flow velocity of the liquid curable resin 16 that goes around from the side of the opening 15.

Figure 24:
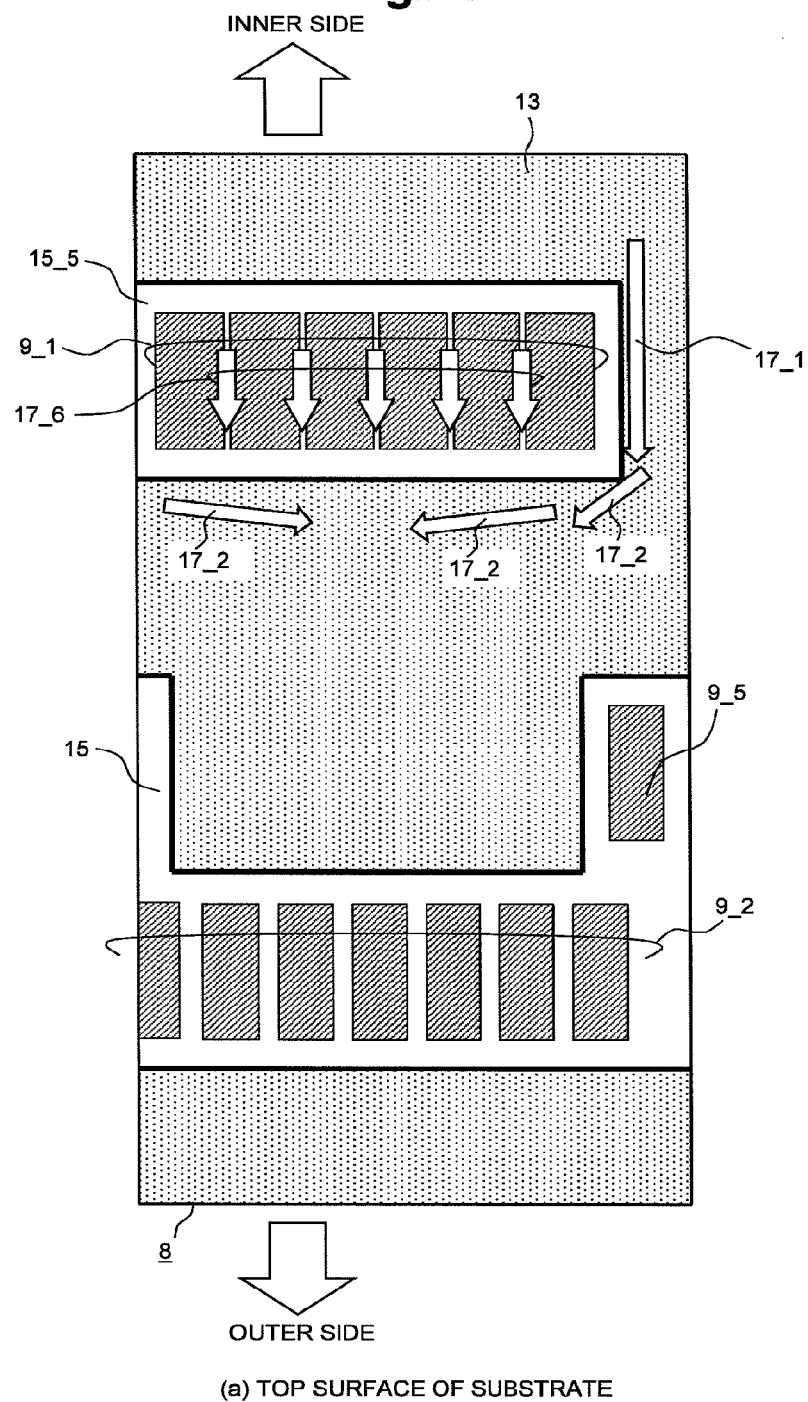
FIG. 24 is a layout diagram illustrating an example of an arrangement of substrate pads in a substrate of a semiconductor device according to an eighth embodiment.

FIG. 24 shows a layout diagram illustrating an example of arrangement of substrate pads in a substrate of a semiconductor device according to an eighth embodiment. Similar to FIG. 23 and the like, FIG. 24 is a top view of the substrate 8, and the pad arrays 2_2, 2_1, and 2_5 (not shown) of the semiconductor chip 1, and the substrate pad arrays 9_2, 9_1, and 9_5 that are shown are the same as those of FIG. 23. Respective configurations thereof are the same as the configurations described with reference to FIG. 19 and FIG. 23, and thus description thereof will not be repeated. The shape of the solder resist opening 15_5 is a rectangular shape similar to FIG. 18, FIG. 19, and the like, but in the eighth embodiment, the gap in the substrate pad array 9_1 is set to be as narrow as possible. A flow velocity of a liquid curable resin 16 that flows through a gap in the substrate pad array 9_1 as indicated by an arrow 17_6 becomes faster than that of the liquid curable resin 16 that flows through a gap in the substrate pad array 9_1 in the example shown in FIG. 19 due to a capillary phenomenon. As a result, the velocity of the flow 17_6 of the liquid curable resin 16 that flows through an opening 15_5 is approximately equal to that of flows 17_1 and 17_2 of the liquid curable resin 16 that passes through the side of the opening 15_5 and goes around to the outer side of the opening 15_5, or even when slower, a degree of slowness is further mitigated as in comparison to the example shown in FIG. 18, and thus it is possible to reduce an amount of air that is pushed out to an end of the opening 15_5 and is trapped due to the cutting-off of an escape route. As a result, it is possible to increase the number of the substrate pads 9_1 that can be included in one opening 15_5 as in comparison to the sixth embodiment.

According to this, even when the liquid curable resin 16 is pre-applied as an underfill, and then the semiconductor chip 1 is compressed and bonded to the substrate 8 to carry out flip-chip mounting, a large void 19 that spans a plurality of substrate pads is not formed in the solder resist opening 15, and thus reliability of the semiconductor device 20 can be increased.

Ninth Embodiment

Shape of Substrate Pad in Solder Resist Opening

Description will be made with respect to yet another embodiment of the embodiments based on the second solving means to solve the above-described new problem, that is, the technical idea of increasing a flow velocity of the liquid curable resin 16 that passes through the opening 15, thereby removing a difference with the flow velocity of the liquid curable resin 16 that goes around from the side of the opening 15.

Figure 25:
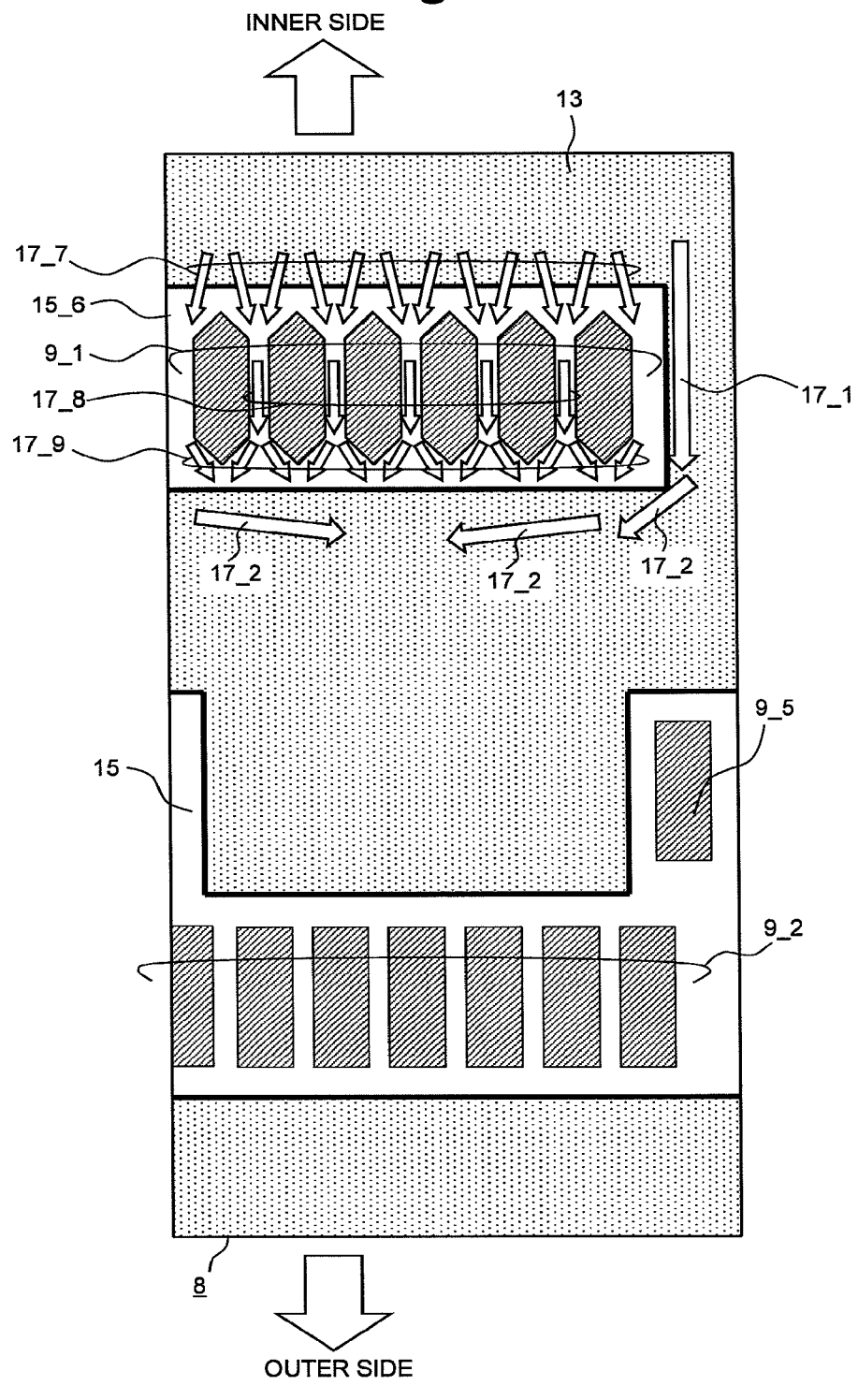
FIG. 25 is a layout diagram illustrating an example of a shape of substrate pads that are arranged in a solder resist opening in a substrate of a semiconductor device according to a ninth embodiment.

FIG. 25 shows a layout diagram illustrating an example of a shape of substrate pads 9_1 that are arranged in a solder resist opening 15_6 in a substrate of a semiconductor device according to a ninth embodiment. Similar to FIG. 23, FIG. 24, and the like, FIG. 25 is a top view of the substrate 8, and the pad arrays 2_2, 2_1, and 2_5 (not shown) of the semiconductor chip 1, and the substrate pad arrays 9_2, 9_1, and 9_5 that are shown are the same as in FIGS. 23 and 24. Respective configurations thereof are the same as the configurations described with reference to FIG. 19 and FIG. 23, and thus description thereof will not be repeated. The shape of the solder resist opening 15_6 is a rectangular shape similar to in FIG. 18, FIG. 19, FIG. 24, and the like, but in the ninth embodiment, consideration is taken regarding the shape of the substrate pads 9_1 that constitute the inner substrate pad array. Each of the substrate pads 9_1 that constitute the inner substrate pad array in the solder resist opening 15_6 has a convex portion at a side that is far away from the outer substrate pad array. As indicated by an arrow 17_7, the flow of the liquid curable resin 16 that passes through the opening 15_6 of the solder resist 13 is concentrated in a gap between the plurality of substrate pads 9_1. The flow of the liquid curable resin 16 is concentrated in the gap between the substrate pads 9_1, and as indicated by an arrow 17_8, the liquid curable resin 16 flows through the gap between the substrate pads 9_1. At this time, since the flow is concentrated, the flow velocity does not become slow as in comparison to the liquid curable resin 16 that passes through the side of the opening 15 as indicated by an arrow 17_1, or a degree of slowness is further mitigated as in comparison to the example shown in FIG. 18. Accordingly, it is possible to reduce an amount of air that is pushed out to an end of the opening 15_6 and is trapped due to the cutting-off of an escape route. Further, when a convex portion is also provided to each of the substrate pads 9_1 at a side that is close to the outer substrate pad array, the flow of the liquid curable resin 16 is guided as indicated by an arrow 17_9, and thus it is possible to disperse air that is trapped, that is, sites at which the void 19 occurs.

As described above, the problem in that the void 19 is formed over plurality of substrate pads 9 can be prevented, or even when the problem occurs, probability thereof is greatly reduced. As a result, it is possible to increase the number of the substrate pads 9_1 that can be included in one opening 15_6 as in comparison to the sixth embodiment.

According to this, even when the liquid curable resin 16 is pre-applied as an underfill, and then the semiconductor chip 1 is compressed and bonded to the substrate 8 to carry out flip-chip mounting, a large void 19 that spans a plurality of substrate pads is not formed in the solder resist opening 15_6, and thus reliability of the semiconductor device 20 can be increased.

Tenth Embodiment

Capillary Phenomenon by Outward Interconnection Connected to Substrate Pad at Both Ends of Solder Resist Opening Description will be made with respect to an embodiment based on the third solving means to solve the above-described new problem, that is, the technical idea of delaying the liquid curable resin 16 going around from the side of the opening 15 from reaching the outer side of the opening 15 to reduce an amount of air that is trapped, thereby suppressing the size of the void 19 that occurs.

FIG. 26 shows a layout diagram illustrating an example of arrangement of substrate pads and interconnections in a substrate of a semiconductor device according to a tenth embodiment. Similar to FIG. 17, (a) of FIGS. 18 and 19, and FIGS. 20 to 25, (a) of FIG. 26 is a top view of the substrate 8, and (b) of FIG. 26 is an X-Y cross-sectional view. The pad arrays 2_2, 2_1, and 2_5 (not shown) of the semiconductor chip 1, and the substrate pad arrays 9_2, 9_1, and 9_5 that are shown are the same as FIG. 18, and respective configurations thereof are the same as the configurations described with reference to FIG. 18, and thus description thereof will not be repeated.

In the tenth embodiment, interconnections 12_11 to 12_15, which carry out electrical connection between substrate pads of the inner substrate pad array 9_1 and substrate pads that constitute the substrate pad array 9_5 or the outer substrate pad array 9_2, are interconnected on the substrate 8. Substrate pads 9_1_11 and 9_1_15 of the inner substrate pad array 9_1 are connected to substrate pads 9_5_11 and 9_5_15 of the substrate pad array 9_5 through the interconnections 12_11 and 12_15, respectively. Substrate pads 9_1_12 and 9_1_14 are connected to substrate pads 9_2_12 and 9_2_13 of the outer substrate pad array 9_1 through the interconnections 12_12 and 12_14, respectively. A substrate pad 9_1_13 is connected to a via 11 through the interconnection 12_13.

As shown in the cross-sectional view (b) of the X-Y cross-section in a chip-mounted state, the interconnections 12_11 to 12_15 are covered with a solder resist 13. In the other words, a gap between the semiconductor chip 1 and the substrate 8 is made narrow over the interconnections 12_11 to 12_15 due to the solder resist 13. At a portion at which the gap is narrow, the flow of the liquid curable resin 16 is promoted due to the capillary phenomenon, and thus a flow velocity becomes faster.

In the top view (a), the flow 17 of the liquid curable resin 16 when the liquid curable resin 16 is pre-applied and then the semiconductor chip 1 is compressed is indicated by arrows. The pre-application region 18 is in the vicinity of the center of the mounting position 29, and thus the liquid curable resin 16 is pushed out from an inner side to an outer side (from an upper side to a lower side in FIG. 26). At this time, a flow velocity of the liquid curable resin 16 that passes through an opening 15_7 of the solder resist 13 becomes slower than that of the liquid curable resin 16 that passes through the side of the opening 15_7. When the flow of the liquid curable resin 16, which passes through the side of the opening 15_7 and goes around to the outer side of the opening 15_7, reaches the outer side of the opening 15_7 more quickly than the flow of the liquid curable resin 16 that passes through the opening 15_7, an escape route of air that is pushed out is cut off, and the air is trapped at an end of the opening 15_7. The trapped air becomes the air bubble, that is, the void 19, and remains in the underfill 16 even after the liquid curable resin is cured. However, in the tenth embodiment, the flow 17_2 of the liquid curable resin 16 that passes through the side of the opening 15_7 and goes around to the outer side of the opening 15_7 is guided in a direction of the interconnections 12_11 and 12_15. As shown in (b), at the top portions of the interconnection 12_11 and 12_15, the gap between the semiconductor chip 1 and the substrate 8 is narrower than in comparison to other portions, and thus a flow 17_10 of the liquid curable resin 16 is promoted due to the capillary phenomenon. Therefore, a flow 17_11 of the liquid curable resin 16 that goes around to the outer side of the opening 15_7 is diminished. In contrast, in the liquid curable resin 16 that passes through the opening 15_7, a flow 17_12 and the like of the liquid curable resin 16 are promoted due to the capillary phenomenon caused by the presence of the interconnections 12_12 to 12_14.

As described above, the flow 17_12 of the liquid curable resin 16 that passes through the opening 15_7 is promoted due to the capillary phenomenon, but the flow 17_2 of the liquid curable resin 16 that passes through the side of the opening 15_7 and goes around to the outer side of the opening 15_7 is guided in a direction of the interconnections 12_11 and 12_15 and thus the flow 17_2 is diminished. Accordingly, an amount of the air which is pushed out from the opening 15_7 and an escape route of which is cut off is reduced or the air disappears. The size of the void 19 is determined depending on the amount of the air the escape route of which is cut off. Since the amount of the air is reduced or the air disappears, it is possible to reduce the size of the void that is generated, or it is possible to suppress occurrence of the void.

At the right side of FIG. 26, the interconnection 12_15 that connects the substrate pad 9_5_15 and the substrate pad 9_1_15 on a side further inward in comparison to the substrate pad 9_1_16 instead of the substrate pad 9_1_16 located at an end of the opening 15_7 is exemplified, but it is more effective to use an interconnection for connection with the substrate pad 9_1_16 located at the corner of the opening 15_7. This is because it is not necessary to consider occurrence of the void 19 that spans the substrate pads 9_1_15 and 9_1_16. In addition, since it is sufficient as long as the interconnections 12_12 to 12_14 can guide the flow of the liquid curable resin 16 and the flow of air, and an amount of the air an escape route of which is cut off can be reduced or the air can disappear, it is not necessary for the interconnections 12_12 to 12_14 to be electrically connected to the substrate pads 9.

When the semiconductor device 20 employs the above-described configuration, even when the liquid curable resin 16 is pre-applied as an underfill, and then the semiconductor chip 1 is compressed and bonded to the substrate 8 to carry out flip-chip mounting, a large void that spans a plurality of substrate pads is not formed in the solder resist opening 15, and thus reliability of the semiconductor device 20 can be increased. In addition, in the semiconductor chip 1, a position at which the pads are arranged is determined on the assumption that the semiconductor chip 1 is mounted on the above-described substrate 8, and thus a large void that spans a plurality of substrate pads is not formed in the solder resist opening 15 of the semiconductor device 20 after being mounted, and thus it is possible to provide the semiconductor chip 1 capable of increasing the reliability. For example, signals of the same electric potential may be allocated to pads 2_1_11 and 2_5_11 of the semiconductor chip 1 which face the substrate pads 9_1_11 and 9_5_11, or pads 2_1_15 and 2_5_15 of the semiconductor chip 1 which face the substrate pads 9_1_15 and 9_5_15 in order for an interconnection that is short-circuited on the substrate 8 to be formed. For example, these may be set as a power supply pad or a ground pad.

Hereinbefore, the invention accomplished by the present inventors has been described in detail on the basis of the embodiments, but the invention is not limited thereto, and it is needless to say that various modifications may be made within a range not departing from the gist of the invention.

For example, the inner pad array (in-line pads) and the outer pad array (out-line pads) that are arranged at both sides of the input and output cell array with a predetermined gap may be provided at four sides or partial sides of a rectangular semiconductor chip. In addition, the arrangement may be carried out to a part of each side. Further, the inner pad array and the outer pad array may be formed in combination of the pad arrangements of the first to third embodiments and the related art for a part of each side. Furthermore, a combination of the sixth to tenth embodiments is possible.

What is claimed is:
1. A semiconductor device comprising:
a semiconductor chip which includes a plurality of chip pads; and
a substrate on which the semiconductor chip is flip-chip mounted and which includes substrate pads that are connected to the chip pads, and a via,
wherein the semiconductor chip includes an input and output cell array that is constituted by a plurality of input and output cells including a first input and output cell, a second input and output cell, and a third input and output cell which are linearly arranged and are adjacent to each other,
the plurality of chip pads include a first pad that is electrically connected to the first input and output cell, a second pad that is electrically connected to the second input and output cell, and a third pad that is electrically connected to the third input and output cell,
the substrate includes a first substrate pad that faces and is connected to the first pad, a second substrate pad that faces and is connected to the second pad, and a third substrate pad that faces and is connected to the third pad,
a gap between the first substrate pad and the third substrate pad is narrower than the sum of a minimum width of an interconnection which is permitted from design constraints on the substrate and two times a space value that is required for the interconnection and each of the substrate pads,
in the semiconductor chip,
the first pad and the third pad are arranged adjacent to each other on a side further outward in comparison to the input and output cell array, and
the second pad is arranged on an inner side in comparison to the input and output cell array to be spaced away from each of the first pad and the third pad in such a manner that the second substrate pad is arranged to be spaced away from the first substrate pad and the third substrate pad by a distance that is equal to or greater than the sum of a diameter of the via provided to the substrate on which the semiconductor chip is flip-chip mounted and two times a minimum space value that is required for a gap between the via and each of the substrate pads in design constraints;
wherein the semiconductor chip is flip-chip mounted on the substrate with a liquid curable resin interposed between the semiconductor chip and the substrate,
the semiconductor chip includes a first pad array in which a plurality of pads including the first pad and third pad are adjacent to each other, and are linearly arranged in parallel with the input and output cell array on a side further outward in comparison to the input and output cell array, and a second pad array in which a plurality of pads including the second pad are adjacent to each other, and are linearly arranged in parallel with the input and output cell array on a side further inward in comparison to the input and output cell array,
the substrate includes a solder resist, a first substrate pad array constituted by a plurality of substrate pads that face and are connected to a plurality of pads that constitute the first pad array, and a second substrate pad array constituted by a plurality of substrate pads that face and are connected to a plurality of pads that constitute the second pad array, and the solder resist is provided to a surface of the substrate on which the semiconductor chip is flip-chip mounted, and the solder resist has a solder resist opening in a region in which the plurality of substrate pads that constitute the second substrate pad array are arranged.

2. The semiconductor device according to claim 1, wherein the number of the substrate pads that are arranged in the one solder resist opening is calculated on the basis of a viscosity of the liquid curable resin during flip-chip mounting, a thickness of the solder resist, and a gap between the semiconductor chip and the substrate.

3. The semiconductor device according to claim 1, wherein the solder resist opening has a concave portion in a side that is far away from the first substrate pad array at a position that faces a gap between the plurality of substrate pads, and a convex portion in a side that is close to the first substrate pad array at a position that faces a side of each of the plurality of substrate pads.

4. The semiconductor device according to claim 1, wherein the plurality of substrate pads that constitute the second substrate pad array in the solder resist opening are arranged with a minimum gap that is permitted for the substrate pads from a design aspect.

5. The semiconductor device according to claim 1, wherein each of the plurality of substrate pads that constitute the second substrate pad array in the solder resist opening has a convex portion in a side that is far away from the first substrate pad array.

6. The semiconductor device according to claim 1, wherein among the plurality of substrate pads that constitute the second substrate pad array in the solder resist opening, each of substrate pads at both ends is connected to an interconnection that extends on the substrate toward the first pad array.

7. A semiconductor chip comprising:
an input and output cell array that is constituted by a plurality of input and output cells including a first input and output cell, a second input and output cell, and a third input and output cell which are linearly arranged and are adjacent to each other;
a first pad that is electrically connected to the first input and output cell;
a second pad that is electrically connected to the second input and output cell; and
a third pad that is electrically connected to the third input and output cell,
wherein a substrate on which the semiconductor chip is flip-chip mounted includes a first substrate pad that faces and is connected to the first pad, a second substrate pad that faces and is connected to the second pad, and a third substrate pad that faces and is connected to the third pad,
a gap between the first substrate pad and the third substrate pad is narrower than the sum of a minimum width of an interconnection which is permitted from design constraints on the substrate and two times a space value that is required for the interconnection and each of the substrate pads,
the first pad and the third pad are arranged adjacent to each other on a side further outward in comparison to the input and output cell array, and
the second pad is arranged on a side further inward in comparison to the input and output cell array to be spaced away from each of the first pad and the third pad by a distance that is equal to or greater than the sum of a diameter of a via provided to the substrate on which the semiconductor chip is flip-chip mounted and two times a minimum space value required for a gap between the via and each of the substrate pads on the substrate which is connected to each of the pads of the semiconductor chip in design constraints;

wherein the semiconductor chip is flip-chip mounted on the substrate with a liquid curable resin interposed between the semiconductor chip and the substrate, the semiconductor chip includes a first pad array in which a plurality of pads including the first pad and third pad are adjacent to each other, and are linearly arranged in parallel with the input and output cell array on a side further outward in comparison to the input and output cell array, and a second pad array in which a plurality of pads including the second pad are adjacent to each other, and are linearly arranged in parallel with the input and output cell array on a side further inward in comparison to the input and output cell array, the substrate on which the semiconductor chip is flip-chip mounted includes a solder resist, a first substrate pad array constituted by a plurality of substrate pads that face and are connected to a plurality of pads that constitute the first pad array, and a second substrate pad array constituted by a plurality of substrate pads that face and are connected to a plurality of pads that constitute the second pad array, and the solder resist is provided to a surface of the substrate on which the semiconductor chip is flip-chip mounted, and the solder resist has a solder resist opening in a region in which the plurality of substrate pads that constitute the second substrate pad array are arranged.

8. The semiconductor chip according to claim 7, wherein the number of the substrate pads that are arranged in the one solder resist opening is calculated on the basis of a viscosity of the liquid curable resin during flip-chip mounting, a thickness of the solder resist, and a gap between the semiconductor chip and the substrate.

9. The semiconductor chip according to claim 7, wherein the semiconductor chip further includes third and fourth pad arrays which are linearly arranged at both sides of the second pad array in parallel with the input and output cell array on a side further inward in comparison to the input and output cell array and on a side further outward in comparison to the second pad array, respectively, the substrate on which the semiconductor chip is flip-chip mounted further includes a third substrate pad array constituted by a plurality of substrate pads that face and are connected to a plurality of pads that constitute the third pad array, and a fourth substrate pad array constituted by a plurality of substrate pads that face and are connected to a plurality of pads that constitute the fourth pad array, and pads of the second pad array, which are arranged at an end close to the third pad array, are short-circuited on the substrate with pads of the third pad array which are arranged at an end close to the second pad array, and pads of the second pad array, which are arranged at an end close to the fourth pad array, are short-circuited on the substrate with pads of the fourth pad array which are arranged at an end close to the second pad array.

* * * * *